United States Patent [19]
McEwan

[11] Patent Number: 5,479,120
[45] Date of Patent: Dec. 26, 1995

[54] HIGH SPEED SAMPLER AND DEMULTIPLEXER

[75] Inventor: Thomas E. McEwan, Livermore, Calif.

[73] Assignee: The Regents of the University of California, Oakland, Calif.

[21] Appl. No.: 241,000

[22] Filed: May 11, 1994

Related U.S. Application Data

[63] Continuation-in-part of Ser. No. 942,164, Sep. 8, 1992.
[51] Int. Cl.⁶ .................................................. H03K 5/06
[52] U.S. Cl. .................................................. 327/91; 327/94
[58] Field of Search .................................. 327/91, 94, 415, 327/92; 324/76.15

[56] References Cited

U.S. PATENT DOCUMENTS

| 3,209,263 | 9/1965 | Keiper, Jr. | 327/277 |
| 4,833,445 | 5/1989 | Buchele | 327/91 |
| 4,866,441 | 9/1989 | Conway et al. | 341/122 |
| 4,866,711 | 9/1989 | Borup et al. | 370/108 |

FOREIGN PATENT DOCUMENTS 2249646  5/1992  United Kingdom ................ 327/94

Primary Examiner—Andrew M. Dolinar
Attorney, Agent, or Firm—Henry P. Sartorio

[57] ABSTRACT

A high speed sampling demultiplexer based on a plurality of sampler banks, each bank comprising a sample transmission line for transmitting an input signal, a strobe transmission line for transmitting a strobe signal, and a plurality of sampling gates at respective positions along the sample transmission line for sampling the input signal in response to the strobe signal. Strobe control circuitry is coupled to the plurality of banks, and supplies a sequence of bank strobe signals to the strobe transmission lines in each of the plurality of banks, and includes circuits for controlling the timing of the bank strobe signals among the banks of samplers. Input circuitry is included for supplying the input signal to be sampled to the plurality of sample transmission lines in the respective banks. The strobe control circuitry can repetitively strobe the plurality of banks of samplers such that the banks of samplers are cycled to create a long sample length. Second tier demultiplexing circuitry is coupled to each of the samplers in the plurality of banks. The second tier demultiplexing circuitry senses the sample taken by the corresponding sampler each time the bank in which the sampler is found is strobed. A plurality of such samples can be stored by the second tier demultiplexing circuitry for later processing. Repetitive sampling with the high speed transient sampler induces an effect known as "strobe kickout". The sample transmission lines include structures which reduce strobe kickout to acceptable levels, generally 60 dB below the signal, by absorbing the kickout pulses before the next sampling repetition.

31 Claims, 13 Drawing Sheets

HIGH SPEED SAMPLER AND DEMULTIPLEXER

The United States government has rights in this invention pursuant Contract Number W-7405-ENG-48 between the United States Department of Energy and the University of California for the operation of Lawrence Livermore National Laboratory.

CONTINUATION APPLICATION DATA

The present application is a continuation-in-part of application Ser. No. 07/942,164, Filed Sep. 8, 1992, entitled HIGH SPEED TRANSIENT SAMPLER, invented by Thomas E. McEwan.

RELATED APPLICATION DATA

The present application is related to co-pending application Ser. No. 08/240,999, entitled TRANSIENT DIGITIZER WITH DISPLACEMENT CURRENT SAMPLERS, (IL-9394), having the same inventor and filed on the same day as the present application.

BACKGROUND OF THE INVENTION

FIELD OF THE INVENTION

The present invention relates to the samplers used for measuring characteristics of high speed signals, such as used with transient digitizers and high speed oscilloscopes.

DESCRIPTION OF RELATED ART

A conventional oscilloscope displays a waveform in step with an external event, or in "real time". The trace of the waveform sweeps across the screen in a matter of nanoseconds or picoseconds, for example, and then quickly fades. For a human observer to see the trace, repeated sweeps are usually needed to make the trace appear with an observable, steady brightness. Thus, a repetitive input signal is required. Transient digitizers circumvent the need for a repeated input by electrically recording the transient event in real time for later readout or viewing at a much slower rate, in what is known as "equivalent time".

There are two basic types of transient digitizers on the commercial market, one based on CRT technology and the other based on a continuously running Analog-to-Digital Converter (ADC). The fastest of the two are the CRT-based digitizers, and they are based on a dual electron-beam approach. One beam operates in real time and writes a trace onto a screen containing a charge-storing diode array. The diode array captures the charge deposited by the "writing" beam and that charge is later read-out by a "read" beam at a slow, equivalent-time rate. The disadvantage to the CRT approach lies in the expensive and bulky CRT, and ultimately, in its limited bandwidth. At least two companies offer a CRT-based digitizer, an 80 picosecond risetime unit by Tektronix and a 50 picosecond unit by Intertechnique of France.

The continuously running Analog-to-Digital Converter (ADC) electrically samples the signal and very rapidly converts the sample to a digital number for real-time storage in digital memory. A limitation of the ADC digitizer is that it must perform complicated operations in real-time, i.e., convert signals to binary data and store the result in a large digital memory array before the next sample is taken. The fastest ADC-based digitizer is about 10 times slower than a CRT digitizer and requires a large amount of power and cooling. Nevertheless, these relatively low bandwidth ADC devices have been at the focus of the electronics marketplace since they are the core technology of a recent oscilloscope development, the Digital Storage Oscilloscope (DSO). DSOs can function as transient digitizers at speeds running 10–1000 times slower than CRT-based digitizers.

Other prior art digitizers are based on a periodically-tapped transmission line, with a sample and hold circuit located at each tap. See, Hornak, U.S. Pat. No. 4,825,103, entitled SAMPLE AND HOLD CIRCUIT; Sedlmeyer, et al., "ANALYZER FOR FAST SINGLE EVENTS", reprinted from "NUCLEAR ELECTRONICS III" by the International Atomic Energy Agency Vienna, 1962; Schwarte, "Sampling System for Recording Fast Single Events", ELECTRONICS LETTERS, Vol. 8, No. 4, Feb. 24, 1972; Riad, "Modeling of the HP-1430A Feedthrough Wideband (25-ps) Sampling Head", IEEE TRANSACTIONS ON INSTRUMENTATION AND MEASUREMENT, Vol. IM-31, No. 2, June, 1982, pp. 110–115.

The tapped-transmission line architecture is attractive for a number of reasons. First, the sample and hold circuits located at each tap can operate at speeds well above that of the competing technologies. Experimental single samplers have been operated at 1.3 ps risetime. Rodwell, et al., "GaAs Nonlinear Transmission Lines for Picosecond Pulse Generation and Millimeter Wave Sampling", IEEE TRANSACTIONS ON MICROWAVE THEORY AND TECHNIQUES, Vol. 39, No. 7, July, 1991, pp. 1194–1204. In contrast, CRT technology is believed to be limited to about 50 ps.

Demultiplexers have been used to increase the effective input sample rate of digitizers. A demultiplexer performs the inverse operation of a multiplexer by accepting sequential signals from a single input, and through a commutating action, distributes samples of the input to multiple outputs.

A key feature of a demultiplexer is that it provides a substantially reduced sample rate to each of the outputs of the demultiplexer relative to the effective input sample rate. For instance, if there are 100 outputs and the input sample rate is 10 gigasamples/sec (GS/s), the output sample rate is reduced by a factor of 100 to 0.1 GS/s. Essentially, the demultiplexer provides a means to slow data rates by performing a serial-to-parallel conversion.

If a sample and hold (S/H) circuit is located at each output, a sampling demultiplexer is formed. Thus, rapidly changing input signals can be distributed to multiple S/H outputs, where each output sample is held steady by the S/H for subsequent processing, such as analog-to-digital (A/D) conversion at a rate slower than the effective sampling rate by a factor of the number of samplers.

The state-of-the-art in A/D conversion is 0.5 GS/s, achieved through the use of one or more monolithic ND chips. For faster conversion rates, a sampling demultiplexer is used to drive multiple ND converters.

The state-of-the-art in sampling demultiplexers is based on high-speed integrated circuits operating at about 4 GS/s. Integrated circuit demultiplexers are limited in several ways: 1) the analog bandwidth of the input circuitry is generally limited to 1 GHz by transistor performance limitations, and 2) the sample rate is limited by the accuracy of the interleave timing, i.e., the ability to accurately locate multiple transistorized sampling circuits in time.

Accordingly, it is desirable to provide a tapped transmission line architecture which provides a robust and simple design for practical applications. Further, a system for high speed sample demultiplexing is needed to improve sample length and spacing.

SUMMARY OF THE INVENTION

The present invention provides a high speed sampling demultiplexer based on a plurality of banks of samplers, each bank comprising a sample transmission line for transmitting an input signal, a strobe transmission line for transmitting a strobe signal, and a plurality of sampling gates at respective positions along the sample transmission line for sampling the input signal in response to the strobe signal.

Strobe control circuitry is coupled to the plurality of banks, and supplies a sequence of bank strobe signals to the strobe transmission lines in each of the plurality of banks, and includes circuits for controlling the timing of the bank strobe signals among the banks of samplers. Input circuitry is included for supplying the input signal to be sampled to the plurality of sample transmission lines in the respective banks. The strobe control circuitry can repetitively strobe the plurality of banks of samplers such that the banks of samplers are cycled to create a long sample length. In this embodiment, second tier demultiplexing circuitry is coupled to each of the samplers in the plurality of banks. The second tier demultiplexing circuitry senses the samples taken by the samplers each time the bank in which the sampler is found is strobed. A plurality of such samples from each sampler position in the plurality of banks can be stored by the second tier demultiplexing circuitry for later processing.

For instance, the second tier demultiplexing circuitry may comprise a plurality of sets of sample and hold circuits, such as commercially available monolithic sample and hold devices which hold on the order of 1,000 samples. Thus, 1,000 cycles of a given bank can be stored with a single integrated circuit sample and hold device for each sampler on the bank. Alternatively, the second tier demultiplexing circuitry may comprise a plurality of analog to digital converters, each coupled to a respective sampler in the plurality of banks.

This invention is :generally based on banks of tapped transmission lines with broadband Voltage sampling circuits located at each tap. In operation, a signal is applied to one end of the transmission line and time-sequential samples of the signal are taken at each tap and stored for later readout at a slow rate. Repetitive sampling with the high speed transient sampler induces an effect known as "strobe kickout", as will be described herein. The present invention reduces strobe kickout to acceptable levels, generally 60 dB below the signal, by employing an architecture that absorbs the kickout pulses before the next sampling repetition.

Strobe kickout is effectively suppressed by utilizing input circuitry which comprises a signal splitter having a high reverse voltage transfer isolation, and by accurate termination of the sample transmission line. The signal splitter may be a passive resistive splitter, or may comprise an active splitter, which includes a high speed FET driver which drives the input signal to the sample transmission line, in parallel with a lower speed operational amplifier based driver stabilizing the lower frequency components of the system.

The strobe control circuitry may comprise a plurality of strobe generators coupled to the respective banks of samplers. The strobe generators are driven by a trigger signal generated by a strobe trigger circuit. The output of the trigger circuit is then supplied through varying lengths of cable to control the timing of each of the plurality of banks.

The timing of the plurality of banks can be precisely controlled using cable length trimming or other adjustable delay techniques, such that the banks can be strobed in a manner which concatenates the samples from the banks in time to create a longer sample length, or the banks can be strobed such that the samples in the respective banks are interleaved in time to increase the effective sample rate.

According to one aspect of the invention, a two-diode sampling bridge is connected to a meandered signal line at one end and to a charge-holding capacitor at the other. The common cathodes are reverse biased. A voltage step is propagated down a second transmission line, the strobe line. As the step propagates past a capacitive pickoff, displacement current i=c(dv/dT), flows into the cathodes, driving the bridge into conduction and thereby charging the charge-holding capacitor to a value related to the signal. A charge amplifier converts the charge on the charge-holding capacitor to an output voltage.

The present invention substantially advances the prior art by combining extremely broadband techniques in a practical way for the first time: discrete transmission lines, Schottky diode sampling bridges, and discrete impulse generators. Using off-the-shelf components, 20–40 GS/s input sampling rates are obtainable, and greater than 1000 GS/s can be realized with custom components. In addition, the analog bandwidth can easily match or exceed the Nyquist limit of one-half the sampling rate.

A primary application for the present invention is signal acquisition using digital storage oscilloscopes (DSO). DSOs provide waveform storage and digital signal processing while circumventing the use of expensive wideband cathode ray tubes. Key limitations to present DSO performance are limited sampling rates and limited analog bandwidth. This invention will improve DSO sampling rates by at least an order-of-magnitude with a commensurate increase in analog bandwidth.

Another application is pulse compression. By multiplying the outputs of a plurality of sample gates on a transmission line, precise compression of a train of pulses can be achieved.

Other aspects and advantages of the present invention can be seen upon review of the figures, the detailed description, and the claims which follow.

DESCRIPTION OF THE PREFERRED EMBODIMENTS

Figure 16:
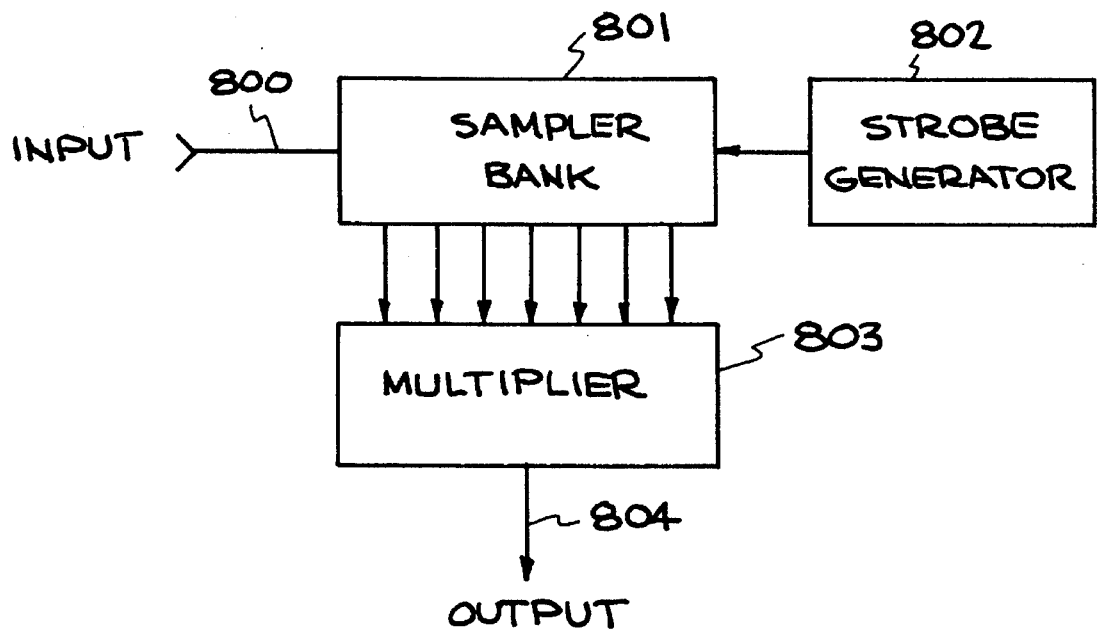
FIG. 16 is a schematic diagram of a pulse compressor according to the present invention.

A detailed description of the present invention is provided with respect to the figures. FIGS. 1, 2, and 5–8 illustrate the architecture and the basic components of a high speed digitizer according to the present invention. FIG. 9 is a block level schematic of a high speed digitizer. FIGS. 10–14 illustrate multiple bank demultiplexer design features according to the present invention. FIG. 15 illustrates a two-tier demultiplexer according to the present invention. FIG. 16 shows use of the sampler as a pulse compressor.

SYSTEM ARCHITECTURE

Figure 1:
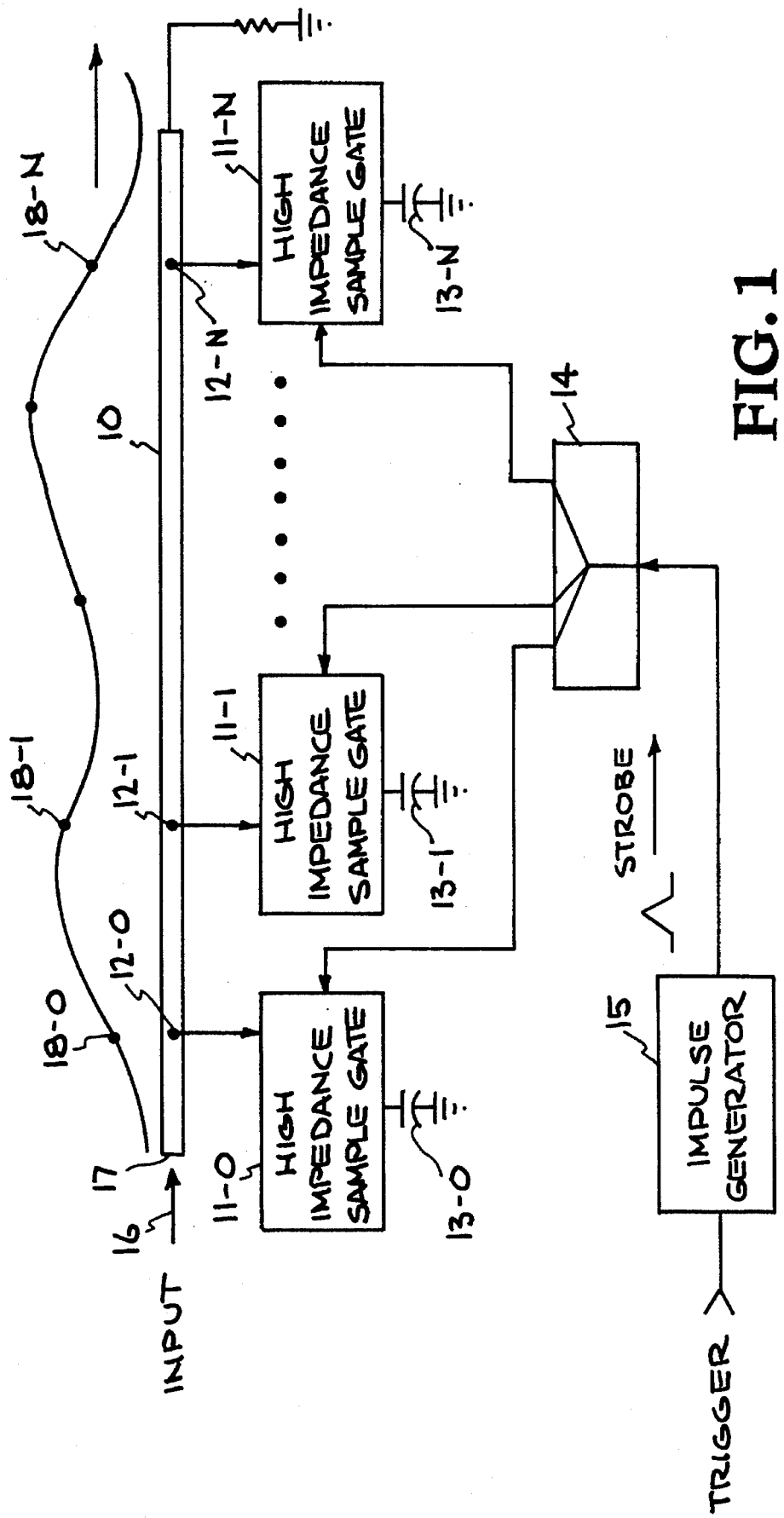
FIG. 1 is a schematic diagram of a high speed sampler according to the present invention.

As illustrated in FIG. 1, a tapped transmission line 10 (which is terminated in a 50 ohm resistor) has a plurality of voltage sampling circuits 11-0 through 11-N connected to a plurality of tapped positions (taps) 12-0 through 12-N on the transmission line. The sampling circuits 11-0 to 11-N are coupled with respective sample holding capacitors 13-0 through 13-N which are connected to ground. In addition, each of the samplers 11-0 through 11-N is coupled to a circuit 14 for distributing a strobe signal. An impulse generator 15 is connected to the strobe distribution circuit 14.

In operation, an input signal 16 is applied to a first end 17 of the transmission line 10. It propagates along the length of the line. Due to the finite velocity of propagation along the line, various portions 18-0, 18-1, . . . , 18-N of the signal appear at each tap 12-0, 12-1 . . . 12-N at a given instant in time. If each sampler at each tap is simultaneously made to sample, or strobed, a discrete replica of the signal will be retained by the sample holding capacitors 13-0, 13-1 through 13-N.

The duration that the samplers are gated open, or strobed, is short compared to the fastest characteristic of the signal on the transmission line. A short gate duration reduces the smearing effect caused by the propagation speed of the signal waveform. In one present reduction to practice, the gate open duration is on the order of 25 to 50 picoseconds. This theoretically limits the maximum bandwidth to less than 20 to 40 Gigahertz. Shorter strobe gates can be used to achieve even greater bandwidths.

Once the samples are taken and stored on the charge holding capacitors 13-0 through 13-N, the samples may be read out sequentially at a low rate. This allows a wide variety of applications of the samplers such as those described with reference to FIG. 2. Also, each sample may be connected to a second demultiplexer for further reducing the sample rate, or each sample may be connected to an ND converter.

Samplers for operating at this speed must be high impedance samplers which apply a very small load on the transmission line and strobe circuit. These sampling gates are described in more detail below. Specifically, the sampling gate must not load the transmission line excessively or the signal would be severely attenuated as it passes along the line. Further, it must not load the strobe circuit excessively or unrealistic strobe voltages would be needed.

Figure 2:
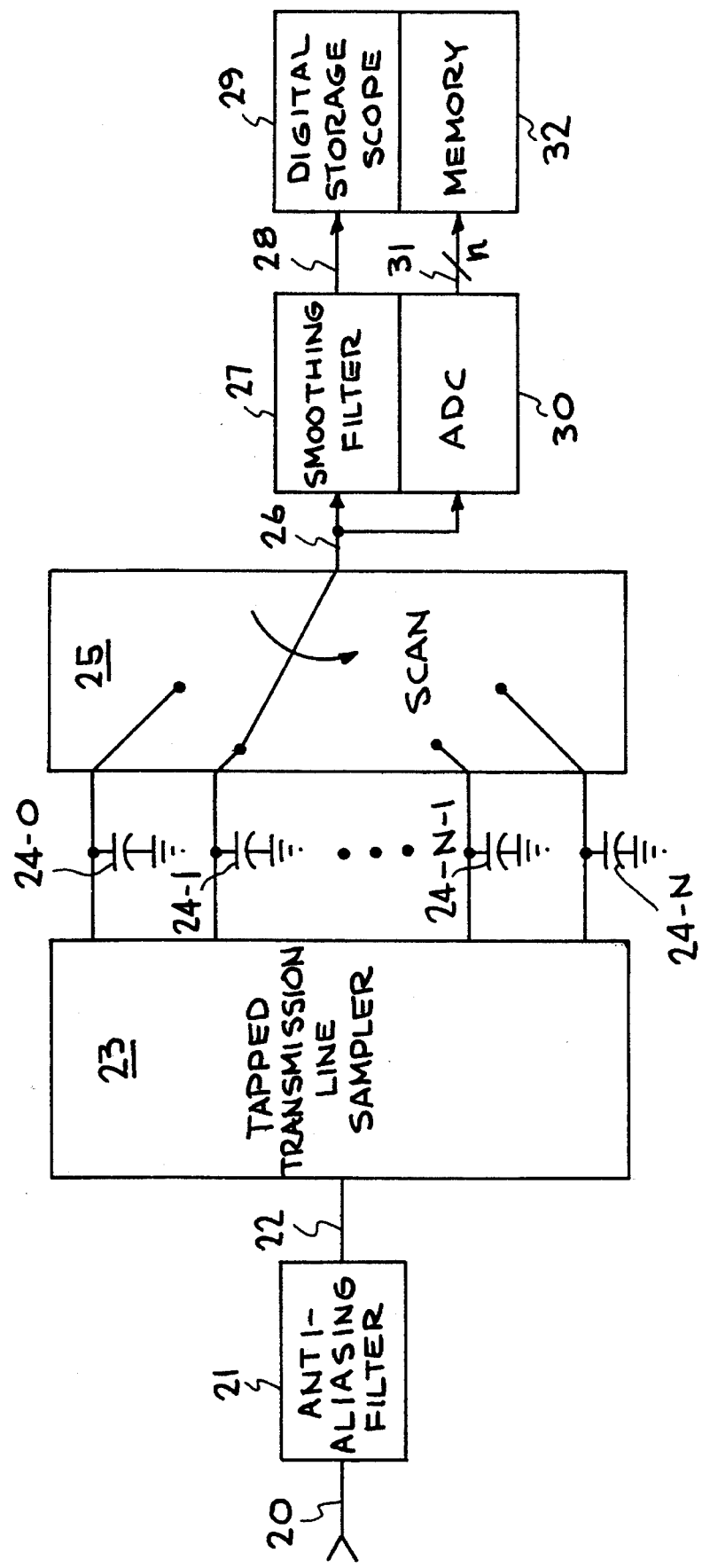
FIG. 2 is a schematic diagram of a system for reconstructing an input signal in equivalent time, and digitizing an input signal.

FIG. 2 illustrates two representative applications of the present invention in a single system. According to FIG. 2, the input signal is supplied on line 20. Line 20 is coupled to an anti-aliasing filter 21. The output of the anti-aliasing filter is supplied on line 22 as the input to the tapped transmission line sampler 23 such as described with reference to FIG. 1. The charge holding capacitors 24-0 through 24-N of the tapped transmission line sampler 23 are coupled to a scanning circuit 25. The output of the scanning circuit is supplied on line 26, and has a form substantially of a bar graph as illustrated in the figure. This output may be supplied to a smoothing filter 27, which reconstructs the input signal on line 28 in equivalent time. With the equivalent time reconstruction of the signal on line 28, a digital storage scope 29 may be used to display a trace of the signal.

Alternatively, the signal on line 26 may be supplied to an analog-to-digital converter 30. Because the sample rate of the scanner 25 is much slower than the; sample rate of the sampler 23, the analog-to-digital converter 30 may be implemented using any of a variety of standard techniques. The output of the analog-to-digital converter is supplied on an N-bit bus 31 to a digital memory 32, where it may be stored for a variety of uses.

According to one implementation, the tapped transmission line sampler 23 has supplied samples on sample holding capacitors 24-0 through 24-N which are spaced in time at about 30 picoseconds on the input signal. The scanner 25 scans each of the charge holding capacitors with a time between samples of about 3 microseconds, in equivalent time five orders of magnitude slower.

The anti-aliasing filter on the input to the signal line in the tapped transmission line of sampler 23 may be used to eliminate aliasing effects, or in the time domain, sampling jitter. A suitable filter characteristic would have a maximally flat pass-band with stop-band zeroes. The response of the anti-aliasing filter should show no overshoot or ringing, and should reject alias components by greater than 40 dB. Computer simulations and tests show that a fifth order maximally-flat filter with a Chebychev stop-band can be used. If the rise time of such filter is set to two sample intervals, it becomes essentially impossible to tell that sampling has occurred within the digitizer, upon effective reconstruction of the signal. The anti-aliasing filter, in a preferred system for reconstruction of the signal, has a sample rise time of approximately 2 sample lengths or 60 picoseconds.

As mentioned above, multiple samples of the signal are stored on the charge holding capacitors and sequentially scanned out for reading. Without a sample reconstruction filter 27, the output would resemble a bar graph as illustrated at line 26. By placing a smoothing filter 27 in the output path, the signal may be adequately reconstructed provided the filter (which may be passive linear, active linear, or digital) has an order of 3 or above and a flat phase characteristic. In one reduction to practice, a passive fifth order maximally-flat filter with a Chebychev stop-band was used.

PRIOR ART SAMPLERS

Figure 3:
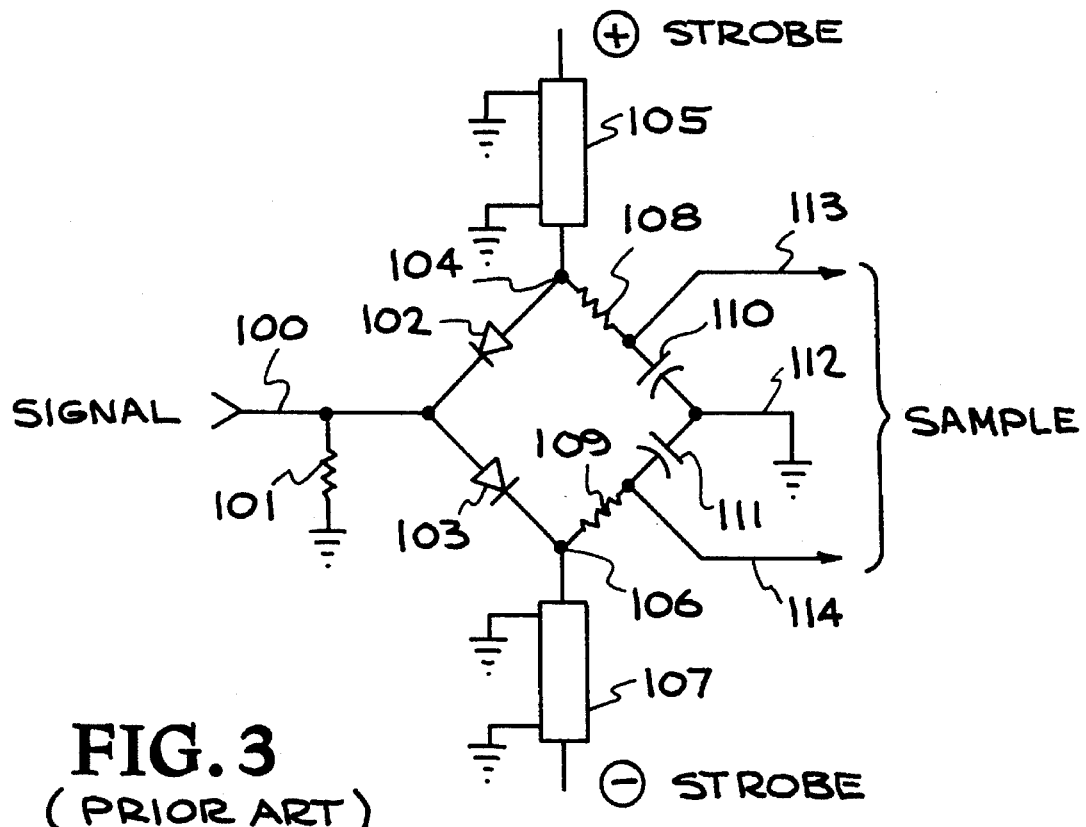
FIGS. 3 and 4 illustrate prior art sampling gate circuits.
Figure 4:
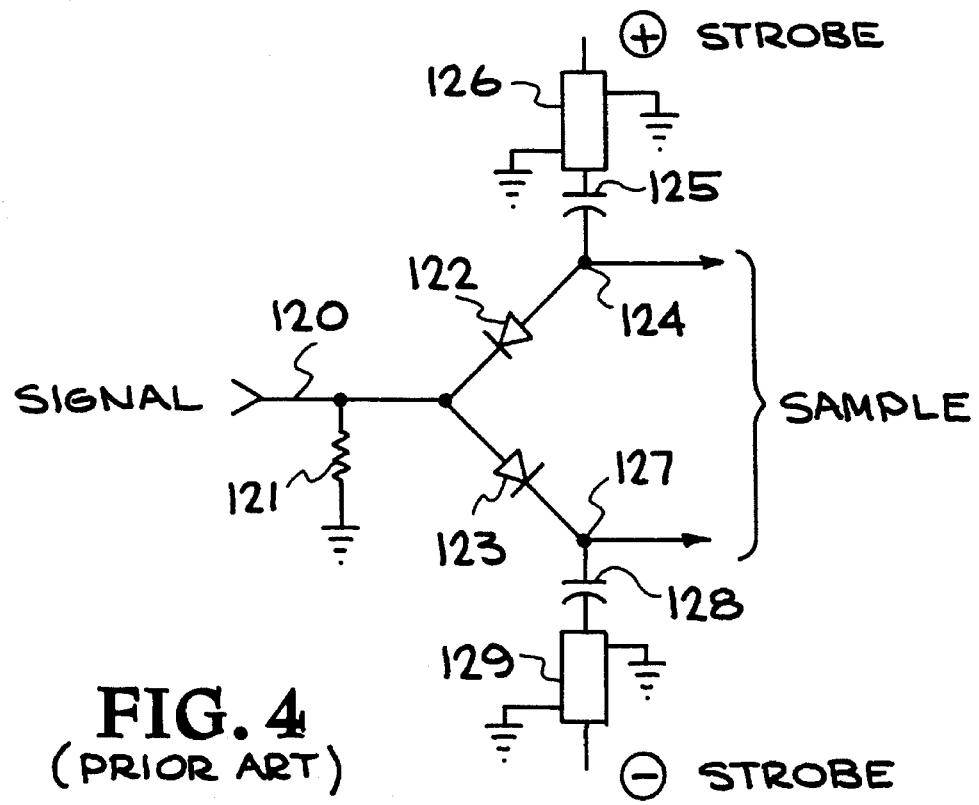

FIGS. 3 and 4 illustrate prior art samplers, limitations of which have prevented the practical application of tapped transmission lines for high speed sampling of signals.

The embodiment of FIG. 3 receives a signal input on line 100. A terminating resistor 101 is coupled to the input. The input is coupled to the cathode of a first diode 102 and the anode of a second diode 103. The anode of the first diode 102 is coupled to a positive strobe input 104 which receives a strobe across transmission line 105. The cathode of diode 103 is coupled to a negative strobe input 106 which receives a strobe across transmission line 107. The strobe inputs 104 and 106 are coupled across respective resistors 108 and 109 to nodes 113 and 114, respectively, and from nodes 113 and 114 across respective charge holding capacitors 110 and 111 to ground 112. The sample is taken across nodes 113 and 114.

In FIG. 4, the input is supplied on line 120 to which a terminating resistor 121 is connected. The input 120 is coupled to the cathode of a first diode 122 and the anode of a second diode 123. The anode of diode 122 is coupled to node 124 which is connected across charge holding capacitor 125 to a strobe transmission line 126 for the positive strobe pulse. The cathode of diode 123 is connected to node 127 which is connected across charge holding capacitor 128 to a negative strobe transmission line 129. The sample is taken across nodes 124 and 127.

These prior art samplers, based on two diode structures have the problem that when the diodes are not conducting, i.e., are not being strobed, the parasitic capacitance of the diodes form capacitive dividers between the input and the charge holding capacitors $C_h$. (The transfer function of the capacitive divider is $V_{OUT}=V_{IN}*C_d/(C_d+C_h)$, where $C_d$ is the diode capacitance, and $V_{OUT}$ is the "blow-by" voltage on $C_h$.) This capacitive divider allows "blow-by" of the input signal to the output on the order of 5% Since typically sampling efficiencies are also about 5%, the non-sampled blow-by can be as strong as the sampled signal. Thus, these prior art samplers require precisely adjusted subtraction circuits to cancel out blow by. For the tapped transmission line implementation, having large numbers of samplers, it is difficult to tune each of the samplers. Thus, commercial application of tapped transmission lines using these samplers has not been practical.

Other prior art samplers are described in Grove, "Sampling for Oscilloscopes and other RF Systems: DC Through X-Band", IEEE TRANSACTIONS ON MICROWAVE THEORY AND TECHNIQUES, Vol. MTT-14, No. 12, Dec. 1966, pp. 629–635; and Miura, et al., "Monolithic Sampling Head IC", IEEE TRANSACTIONS ON MICROWAVE THEORY AND TECHNIQUES, Vol. MTT-38, No. 12, Dec. 1990, pp. 1980–1985.

HIGH-SPEED SAMPLER

Figure 5:
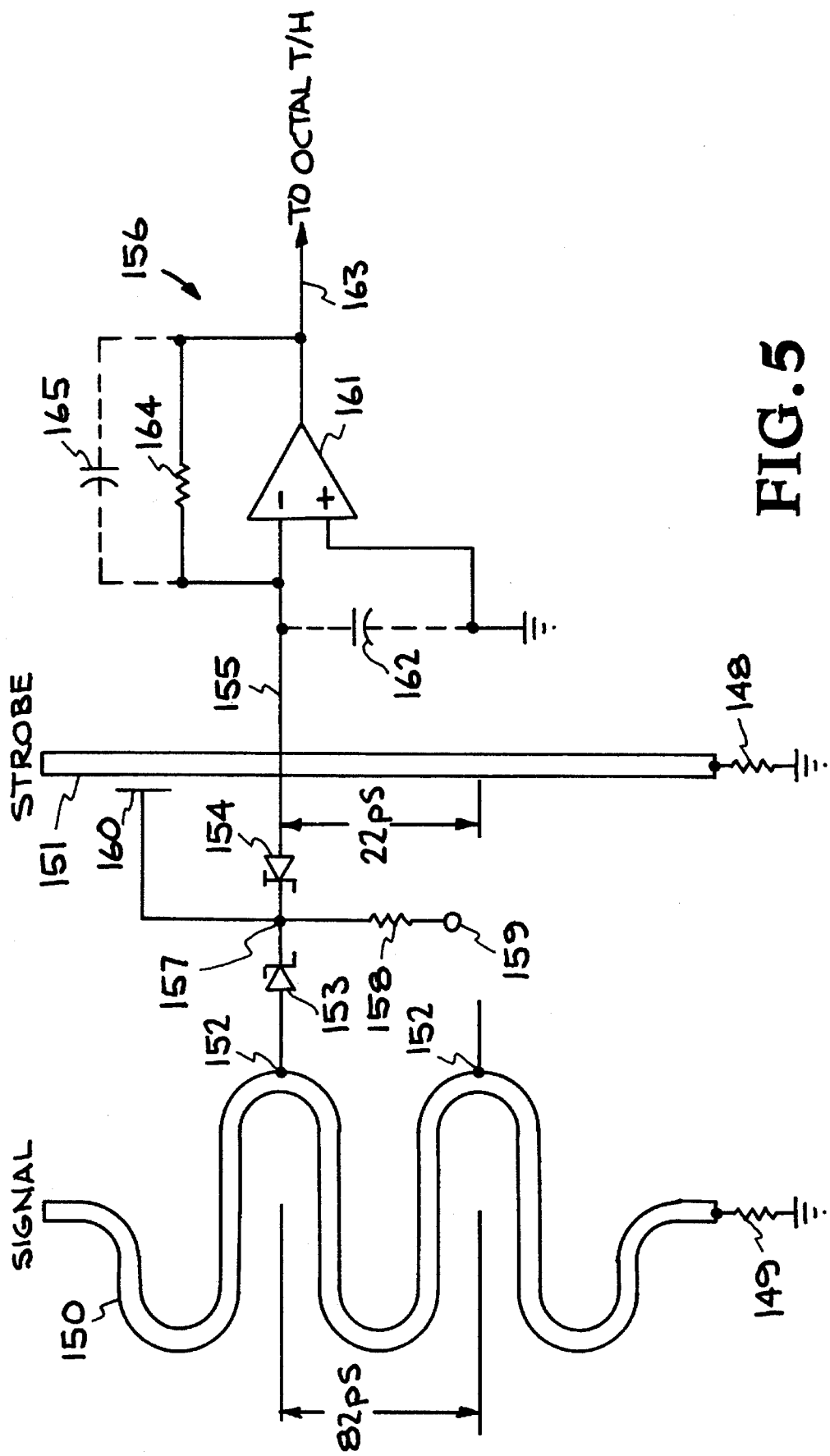
FIG. 5 is a schematic diagram of a high speed sampling gate according to the present invention with a charge displacement strobe pickoff.

FIG. 5 provides a schematic diagram of the high speed sampler according to the preferred embodiment of the present invention. The sampling technology is based on a meandered signal transmission line 150 and a straight strobe transmission line 151. Distributed along the signal line at a plurality of taps 152 are samplers composed of a first Schottky diode 153 and a second Schottky diode 154 connected in a common cathode arrangement. The anode of the diode 153 is coupled to the signal line tap 152. The anode of the diode 154 is coupled to a charge-holding capacitor 162 and to the input on line 155 of a charge amplifier, generally 156. The common cathode node 157 is coupled across resistor 158 to a reference voltage 159 of 2 volts in this embodiment, to reverse bias of the diodes. Also, the common cathode node 157 is coupled to a strobe pickoff structure 160 which lies adjacent the strobe transmission line 151.

The signal transmission line 150 has a 50 ohm termination resistor 149. Similarly, the strobe transmission line 151 has a 50 ohm termination resistor 148.

The strobe pickoff structure 160 consists of a capacitive coupling strip of about 0.05 picofarads, where the second plate is the strobe transmission line 151, itself. As a strobe signal propagates down the strobe transmission line 151, a charge displacement current is induced in the strobe pickoff structure 160.

The charge amplifier consists of an op-amp 161 coupled to the charge holding capacitor 162 at its inverting input. The opposite side of the charge holding capacitor 162 is coupled to ground. Similarly, the positive input of the op-amp 161 is coupled to ground. The op-amp includes a resistor 164 and parallel capacitance 165 in the feedback path. The output of the op-amp 161 is connected to a track and hold circuit not shown in this figure across line 163.

The dashed lines connecting the capacitors 162 and 165 indicate that the devices are implemented by metal of the printed circuit board and component pins, and are therefore not packaged components.

These Schottky diode samplers are uniquely suited to an array structure because of their minimal component count and minimal line loading. Commercial samplers of the type found in high-speed sampling oscilloscopes are fairly complicated, employing up to six Schottky diodes, and they load the gate pulse line. The sampler of FIG. 5 has a very low component count in one embodiment—one dual Schottky diode (common package) and one bias resistor, so the number of samplers in one practical module design (FIG. 6) is 160 and can go to 320 and higher.

When the gate pulse passes the sampler, the rate of change in E-field, between the gate pulse line 151 and a short pick-off strip 160 causes a displacement current to flow that drives the diodes into conduction for a duration related to the negative-going transition time of the gate pulse. The displacement current drives the diodes into conduction, effectively placing a "short" between the signal line and the sample-holding capacitor 162, $C_{hold}$.

$C_{hold}$ 162 is formed by a small metallized patch sandwiched between the outer copper-clad ground layers. When the Schottky diodes conduct, $C_{hold}$ charges :exponentially with a 15 ps time constant, as defined by the transmission line impedance, the sampling diode resistance and the value of $C_{hold}$. $C_{hold}$ charges for about 45 ps, the sampling aperture time, which is set by the 60 ps gate pulse transition time minus about 15 ps, the time required to slew the diode voltage at the common-cathode node from reverse to forward bias. $C_{hold}$ does not need to charge to the full value of the signal voltage, it only needs to consistently charge to the same percentage of the signal voltage—deviations can be corrected in software after read out of the data.

As $C_{hold}$ charges, a certain amount of charge is pulled from the signal line, causing an unavoidable glitch called "kickout" that propagates along the meander line towards the adjacent samplers. It is important that the samplers do not sample each other's kickout, so the sampler spacing along the meandered transmission line must be greater than the kickout duration. Kickout limits how closely the samplers can be placed, and pipe interleaving (where a pipe is a transmission line—strobe line pair having a set of samplers) as described below must be resorted to when the sampler spacing needs to be closer than the gate duration. Interleaving pairs of pipes generally must be done if aliasing is to be avoided.

Once the samples are taken, the charge on each $C_{hold}$ is read out by charge amplifiers. The charge amplifiers and associated readout circuits may be repeated 160 or more times on a single board, so simplicity is important. The present circuitry uses off-the-shelf components that are packaged in multiples, e.g., four charge amplifiers on one chip. An application specific integrated circuit (ASIC) could be used to help reduce the component count as known in the art.

Figure 6:
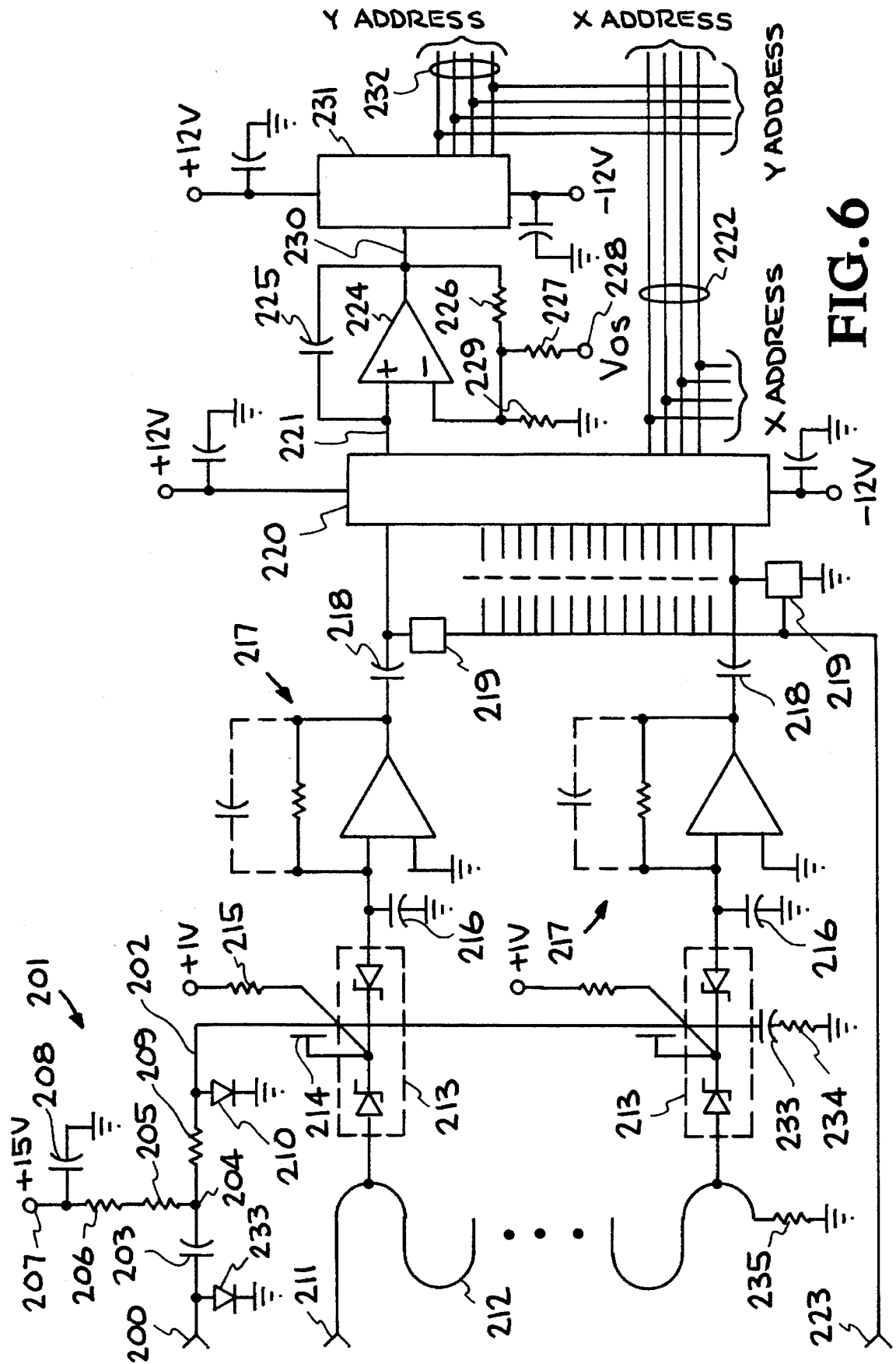
FIG. 6 is a schematic diagram of a tapped transmission line with a plurality of sample gates according to the present invention.

FIG. 6 illustrates a schematic diagram of a 160 sampler embodiment, according to the present invention, which may be placed on a single printed circuit board. The device includes a strobe input 200 coupled to a pulse generating network, generally 201. The pulse generating network drives the strobe transmission line 202. The strobe generating network 201 includes a first step recovery diode 202 having its anode coupled to the strobe input 200 and its cathode coupled to ground. The anode of step recovery diode 202 is coupled through capacitor 203 to node 204. Node 204 is coupled through series resistors 205 and 206 to a 15 volt supply 207. Capacitor 208 is coupled between the supply voltage and ground. Also, resistor 209 is coupled from node 204 to a second step recovery diode 210. Step recovery diode 210 has its anode coupled to the input of the strobe transmission line 202 and its cathode coupled to ground. The strobe transmission line 202 terminates through series capacitor 233 and resistor 234 to ground. More details concerning this pulse generating network are described below.

The signal is supplied at input 211. This signal is coupled across meandered transmission line 212. The signal transmission line terminates through resistor 235 to ground. Coupled to the meandered transmission line are a plurality of sample gates 213. In this embodiment, 16 sample gates are coupled to a single meandered transmission line 212, with 10 lines for the board. The sample gates consist of the common cathode Schottky diodes as discussed above, with respect to FIG. 5. The common cathode node is coupled to a strobe pickoff terminal 214 and across resistor 215 to a supply voltage for reverse biasing the diodes. The anode of the output diode is coupled to a charge holding capacitor 216. The charge holding capacitor 216 is coupled to the charge amplifier, generally 217. This charge amplifier is configured as described above with respect to FIG. 5. The output of the charge amplifier 217 is coupled to a track and hold capacitor 218. The second terminal of capacitor 218 is coupled to a switch 219. Also, the second terminal of the capacitor 218 is coupled as an input to the 16:1 analog multiplexer 220. The analog multiplexer is connected as known in the art to supply 1 of 16 inputs to its output on line 221 in response to the signals on lines 222, referred to as the X address.

The switch 219 is controlled by the track and hold signal supplied at input 223. The track and hold signal supplied on line 223 causes the switches 219 to open and capture the output of the charge amplifiers 217 on the capacitor 218. The charge holding capacitors 216 at the output of the sample gates bleed back to ground level in about 10 microseconds. This limits the speed at which the devices may be cycled for following samples. The relatively large track and hold capacitors 218 provide about 160 microseconds in which to read out the data. This is plenty of time for the multiplexer 220 to sequentially provide the output on line 221 to amplifier 224 at its positive input. The amplifier 224 has capacitor 225 in feedback to its positive input. Also, feedback resistor 226 is coupled to its inverting input. Resistor 227 is coupled from the inverting input of amplifier 224 to an offset voltage reference 228. Because of the single sided strobe transmission line, the offset voltage is used to cancel the baseline of the samplers. The offset voltage is generated from the same supply voltage that is used for generation of the strobe voltage in order to account for any variations in the supply voltage which might be reflected in the strobe pulse.

In addition, resistor 229 is coupled from the inverting input of the operational amplifier 224 to ground. The amplifier 224 provides a gain of about 10 times for the output on line 221. The output of amplifier 224 is supplied on line 230 as an input to multiplexer 231. The output is also supplied from nine other sampling banks (not shown) as inputs to the multiplexer 231. Thus, there is a 16×10 array of samplers on a single printed circuit board. The output of the multiplexer 231 is controlled by the signals on line 232 labelled the Y address. This multiplexer 231 is connected as known in the art.

Figure 7:
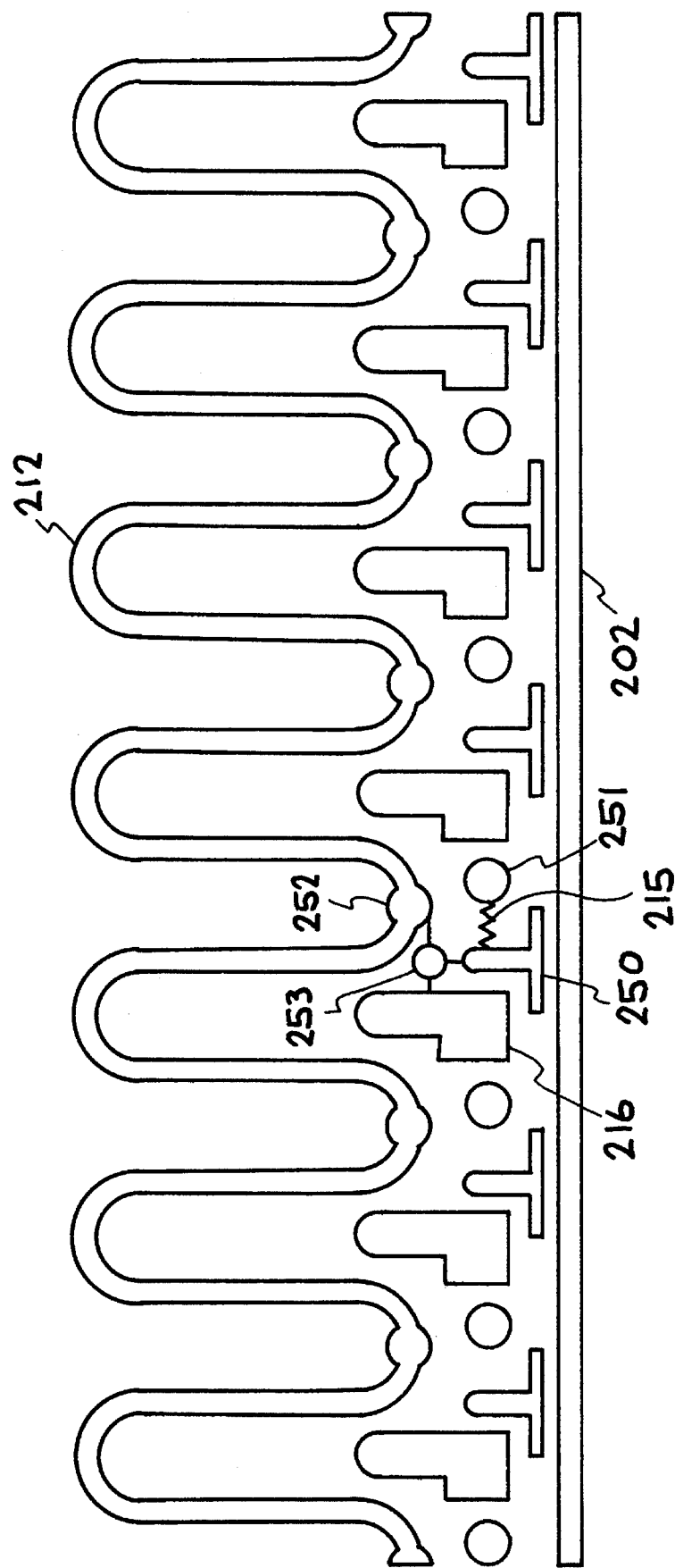
FIG. 7 is a layout diagram illustrating the configuration of the signal line and strobe line for a circuit as shown in FIG. 6.

FIG. 7 shows the layout for a printed circuit board showing the meandered signal line 212 and the straight strobe line 202. The signal line 212 and the strobe line 202 are co-planar. The strobe pickoff structure 250 establishes a capacitance of about 0.05 picofarads with the strobe line 202. As can be seen, it does not contact the strobe line.

The charge holding capacitor 216 corresponds to capacitor 216 of FIG. 6. It is created using a pad. The DC bias pad 251 is coupled through resistor 215 to the strobe pickoff structure 250. A tap is formed on the meandered signal line 212 at enlarged region 252. To compensate for the increased capacitance at the tap 252, the width of the transmission line is narrowed in the region near the tap 252.

The common cathode diodes are mounted in a package 253 between the tap 252, the charge holding capacitor 216 and the strobe pickoff 250.

The new sampler is incorporated into the sampling array structure. The negative-going gate pulse is distributed to the samplers in each pipe via a straight line and the positive-going signal propagates along a meandered line. The gate pulse propagates faster than the signal pulse due to the meander, and causes the samplers to take a snapshot of the signal pulse. The propagation delay along the meander line is 83ps between samplers and along the gate pulse line the delay is 21ps between samplers, for a difference of 62 ps—the sampler spacing in the pipe.

The traces are etched on a copper-clad woven-Teflon substrate 0.25 mm thick. The back side of the substrate is copper clad to form a ground plane and shield for the circuit. Copper cladding is also placed on the top side by overlaying a 0.25 mm woven-Teflon layer with an outer copper cladding. The outer copper-clad layers prevent radiation from the meandered signal line that would otherwise occur at a frequency related to periodicity of the meander, about 12 GHz. Once shielded, the transmission lines form a symmetric stripline, which is free of the frequency-dependent modal dispersion normally associated with substrate-backed microstrip and coplanar waveguide (CPW)lines.

The back side of the sampling array is laminated with two 0.5 mm glass-epoxy circuit board layers that hold analog sample buffers and multiplexers used for serial readout to the 12 bit A-to-D converter. These components are implemented in surface mount technology (SMT) for rapid assembly by automatic insertion machines. The sampling diodes and other high-speed components are surface mounted on the top side of the circuit board.

The sampling array presently contains 10 pipes that are 1 ns long and have 16 samplers each. The gate pulse timing to each pipe can be adjusted to interleave all 10 pipes for 6.25 ps sample spacing and 1 ns record length, or all the pipes can be concatenated for 10 ns record length at 62.5 ps sample spacing.

Figure 8:
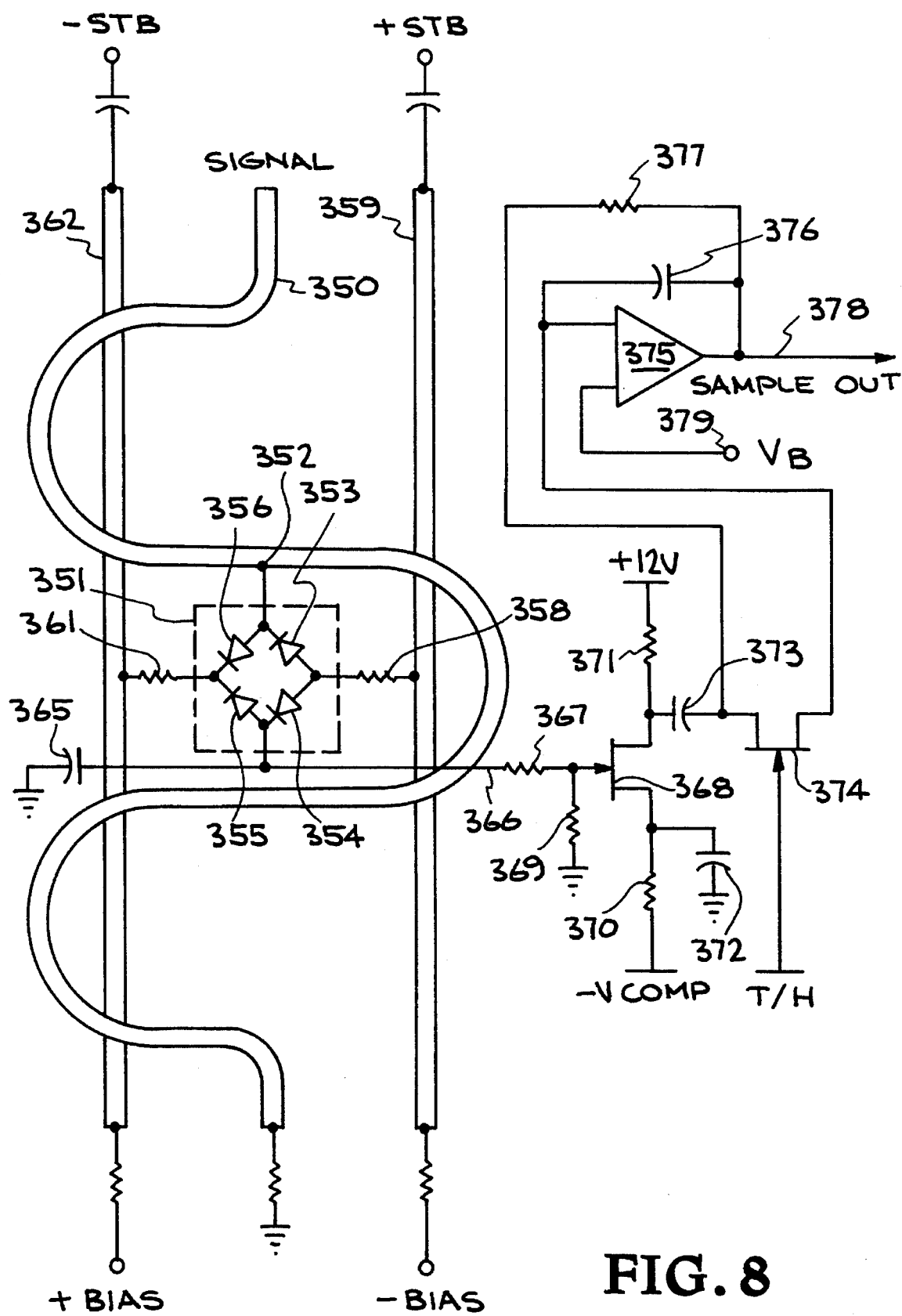
FIG. 8 is a schematic diagram of an alternative sample gate using a four diode structure and balanced positive and negative strobe lines.
Figure 9:
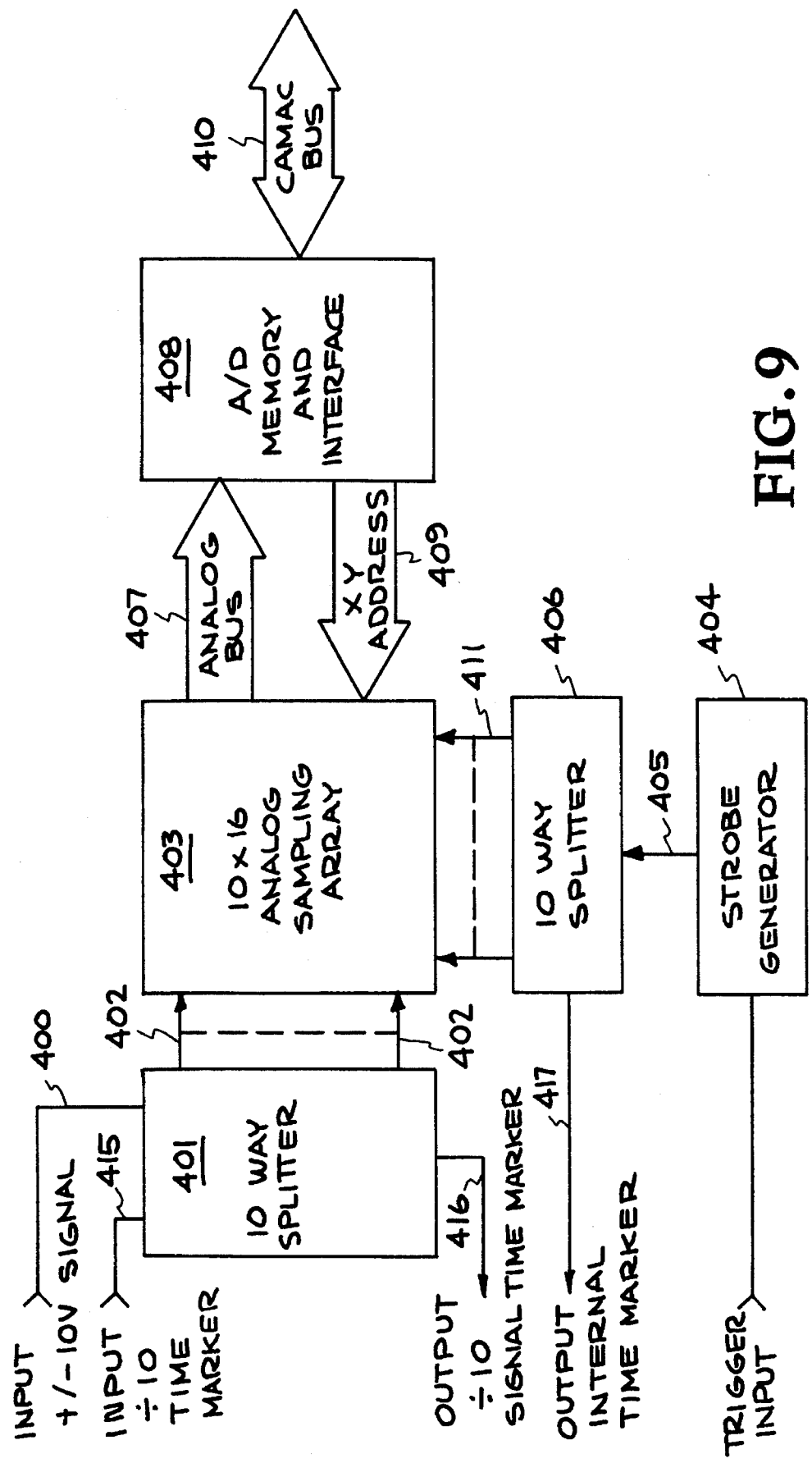
FIG. 9 is a schematic block diagram of a high speed digitizer according to the present invention.

FIG. 8 illustrates a basic sampler according to the present invention having four diodes with high impedance strobe inputs and balanced strobe lines. The input signal is supplied along meandered transmission line 350. A sampler, generally 351, is connected to the transmission line 350 at tap 352. Tap 352 is connected to a diode bridge sampler which includes four diodes 353, 354, 355, and 356 configured in a bridge having four terminals. Other diode bridge embodiments may include series or parallel combinations of diodes, resulting in more than four diodes in the four terminal diode bridge. A first terminal of the bridge is connected across a positive strobe resistor 358 to a positive strobe transmission line 359. A third terminal is coupled across a negative strobe resistor 361 to a negative strobe transmission line 362. The strobe transmission line 159 supplies a positive pulse while the strobe transmission line 162 supplies a negative pulse.

A second terminal of the bridge is connected to tap 352 to receive the input signal. The fourth terminal of the bridge is connected to the charge holding capacitance 365 which is connected to ground. The charge holding capacitance 365 supplies the sample signal on line 366.

The four diode bridge of FIG. 8 solves the blow by problem since the two diodes on the input side of the four diode bridge look into the strobe resistors 358, 361, forming a transmission zero at low frequencies and preventing any permanent charge from transferring to the charge holding capacitance 365. Short transients are coupled through the diodes, but as long as their duration is much shorter than the read out circuitry following the charge holding capacitance 365, the transients are averaged to zero.

Furthermore, the high resistance strobe resistors 358 and 361 provide a significant feature. High resistance here is defined as much higher than the signal transmission line impedance. As the resistance approaches a high value, the net loading of diodes 353–356 on the transmission line approaches that of one diode. This can be seen since the sampler appears as two parallel strings of two diodes in series, which is equivalent to one diode. In the systems of FIGS. 3 and 4, the loading would be two diodes. This single diode loading allows a significantly greater number of samplers to be placed on a single transmission line.

In the embodiment shown in FIG. 8, the signal line and the strobe line are not co-planar, i.e., they are formed on separate layers of a printed circuit board to establish isolation.

The output of the sampler is supplied across line 366 through resistor 367 to the gate of FET buffer 368. Also, resistor 369 is connected from the gate of FET buffer 368 to ground. The FET buffer 368 has a source coupled across resistor 370 to a negative reference voltage, and a drain connected across resistor 371 to a positive reference voltage. Also, capacitor 372 is coupled from the source of buffer 368 to ground. The output of the FET buffer 368 is coupled to one terminal of a track and hold capacitor 373. A switch 374 is coupled between the opposite terminal of the track and hold capacitor 373 and the negative input to buffer 375. The buffer 375 has capacitor 376 in feedback. Also, resistor 377 is coupled from the output of the buffer 375 to the capacitor 373 side of the switch 374. The output of the buffer 375 is the output sample on line 376 which is supplied to multiplexers and such as described above with respect to the other embodiment. A bias voltage $V_B$ is supplied on line 377 to the positive input of the buffer 375.

SAMPLING ARRAY ARCHITECTURE

FIG. 9 provides a schematic block diagram of the 10×16 analog sampling array which is described with respect to FIG. 7. The input signal is supplied on line 400 to a ten way splitter 401. A time marker may be supplied on line 415 to splitter 401, and fed back on line 416 for time reference purposes. The signal is then split onto 10 signal line inputs 402 to the 10×16 analog sampling array 403, which is implemented as described above with respect to FIG. 7. In addition, a strobe generator 404 supplies a strobe trigger on line 405 to a ten way splitter 406. Strobe generator 404 is triggered by a trigger input signal. The strobe splitter 406 may also generate a time marker on line 417. The ten way splitter 406 supplies strobe inputs on lines 411 to strobe generators in the sample array 403. The strobe generator 404 and splitter 406 are described below with reference to FIG. 14.

The outputs of the analog sampling array 403 is an analog bus 407, which is coupled to an analog-to-digital converter and memory module 408. The analog-to-digital converter and memory module 408 generates the X and Y addresses across lines 409 to control the sampling array. The output of the memory device 408 is coupled to a bus 410 for the processing as required.

Figure 10:
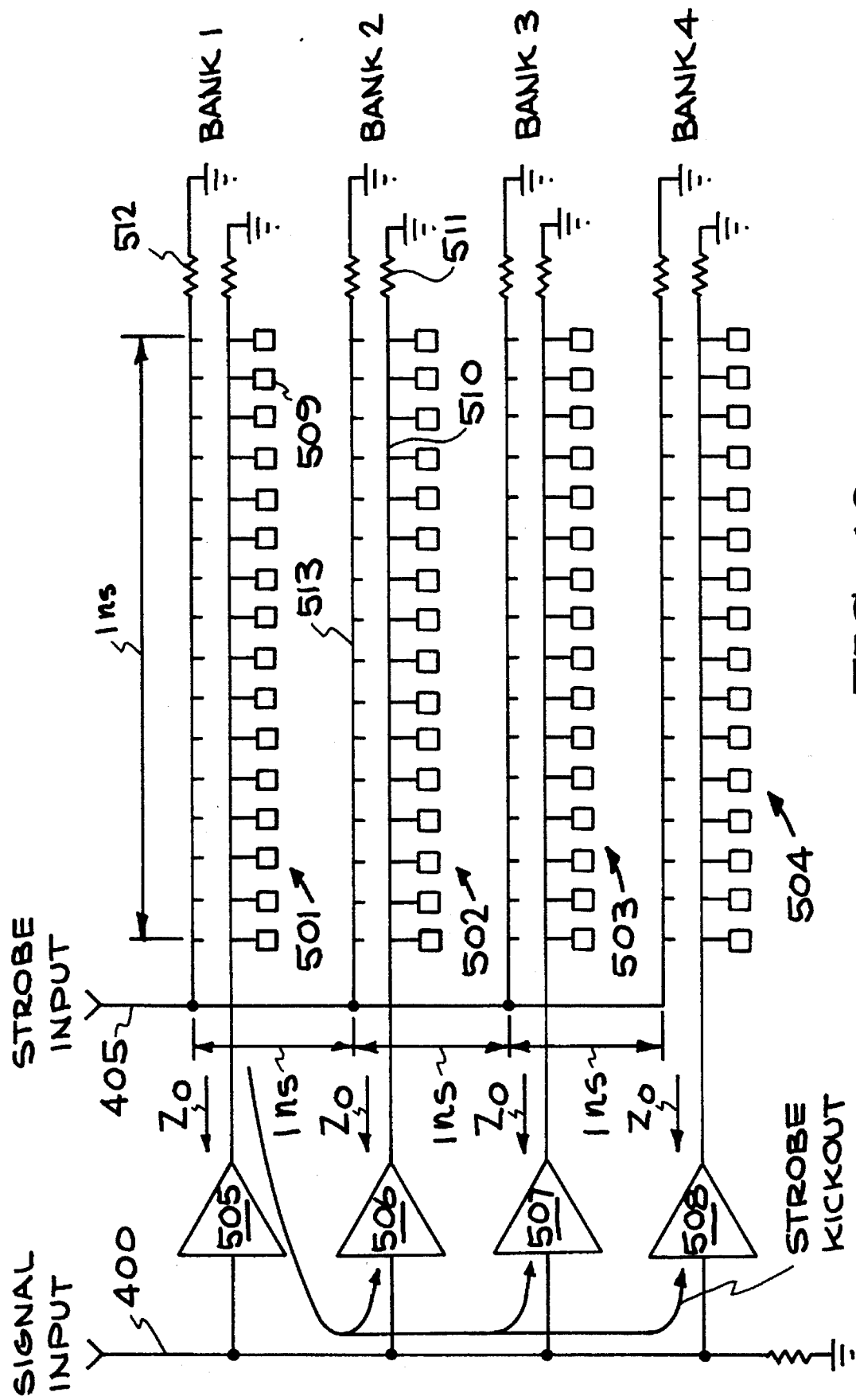
FIG. 10 is a schematic diagram of multiple banks of samplers for use in a high speed demultiplexer illustrating strobe kickout.

FIG. 10 illustrates schematically the structure of the sampling array in a four bank embodiment for the purposes of explaining the strobe kickout.

An N×M (4×16) array of voltage sampling circuits is arranged along "pipes" or banks 501, 502, 503, 504. Each of the N pipes has a meandered transmission line and M sampling circuits evenly spaced along the transmission line as described above. The signal from input line 400 to be measured is split equally to the meandered transmission lines in the pipes through high reverse voltage transfer isolation amplifiers 505, 506, 507, 508. When triggered, a single gate pulse on strobe input line 405 is applied to the first pipe in the array and then, in sequence, to the other pipes.

After sampling, the voltages on the N×M capacitors in the samplers are serially read out to a 12 bit A-to-D converter and the data is stored in digital memory. Software routines then calibrate the data and reconstruct the signal using curve-fitting techniques.

The relative timing of the gate pulses can be used to arbitrarily locate the time position of each pipe, i.e., the time at which the pipes sample the signal. For example, two pipes can be time-interleaved by delaying the gate pulse to the second pipe by one-half a sample spacing, resulting in a doubling of the sampling rate (in gigasamples/sec). Pipes can be time-concatenated by gating successive pipes at an interval equal to the pipe length (in nanoseconds), resulting in a record length (the total duration of the digitized data in nanoseconds) that is N times the length of one pipe.

An inherent property of a diode sampler is strobe kickout, i.e., an aberrant pulse induced on the signal line by the sampler when it is strobed. Strobe kickout is caused by two factors. First, imbalance between the complementary positive and negative strobe pulses of the embodiment of FIG. 8, as would appear on the balanced strobe lines (359, 362), results in a net current flow onto the signal line that is relatively independent of signal amplitude. For positive and negative strobe pulses balanced to 5% of each other in absolute magnitude, strobe kickout is typically about 1% of the full scale range of the input signal. For the embodiment of FIG. 5; there are no balanced strobe pulses, and there is a substantial fixed kickout. The second cause of strobe kickout is the charge slug pulled off the signal transmission line (for the embodiments of FIG. 5 and FIG. 8) to charge the charge-holding capacitor when the sampler is strobed.

Strobe kickout is generally not a problem for low repetition rate digitizers since 1) the kickout pulses propagate to adjacent samplers too late in time to affect the in-bank sampled voltages, and 2) the kickout pulses dissipate at the distal termination and out through the signal line in tens of nanoseconds, well before the next repetition.

As can be seen in FIG. 10, a signal input is supplied on line 400 to a plurality of high reverse voltage transfer isolation amplifiers 505–508 in the plurality of banks 501, 502, 503, and 504 of samplers. Samplers are schematically illustrated by boxes 509. Also, the signal lines are meandered in the actual embodiment, although the meander is not shown in FIG. 10. Each signal line, e.g., signal line 510, has a broadband distal termination resistor 511, and a source termination impedance $Z_0$, established by the amplifier 506. Similarly, the strobe transmission lines have distal termination impedance 512. The strobe input is supplied on line 405 fanned out to the strobe transmission lines, e.g., line 513, in the respective banks.

This invention substantially eliminates the problem of strobe kickout by dividing the tapped signal line into multiple banks of tapped lines (501–504). The strobe timing to each bank is such that only one bank is strobed over a fraction of the total recycle time, allowing strobe kickout to be absorbed by the terminations in each bank before they are restrobed. Using exemplary numbers, each bank is 1 ns long, there are 4 banks, each separated in strobe timing by 1 ns, and the entire system is continually strobed at a 4 ns repetition rate. Bank 1 is first strobed, then banks 2–4 in sequence. Bank 2 is not strobed until the strobe has finished propagating down bank 1, gating all the samples in bank 1. Then bank 2 is strobed so its samplers are time contiguous with the bank 1 samplers, and so on for the other banks. After bank 4 is completely strobed the entire process is repeated with the next strobe pulse in the train of 4 ns interval strobe pulses.

Figure 11:
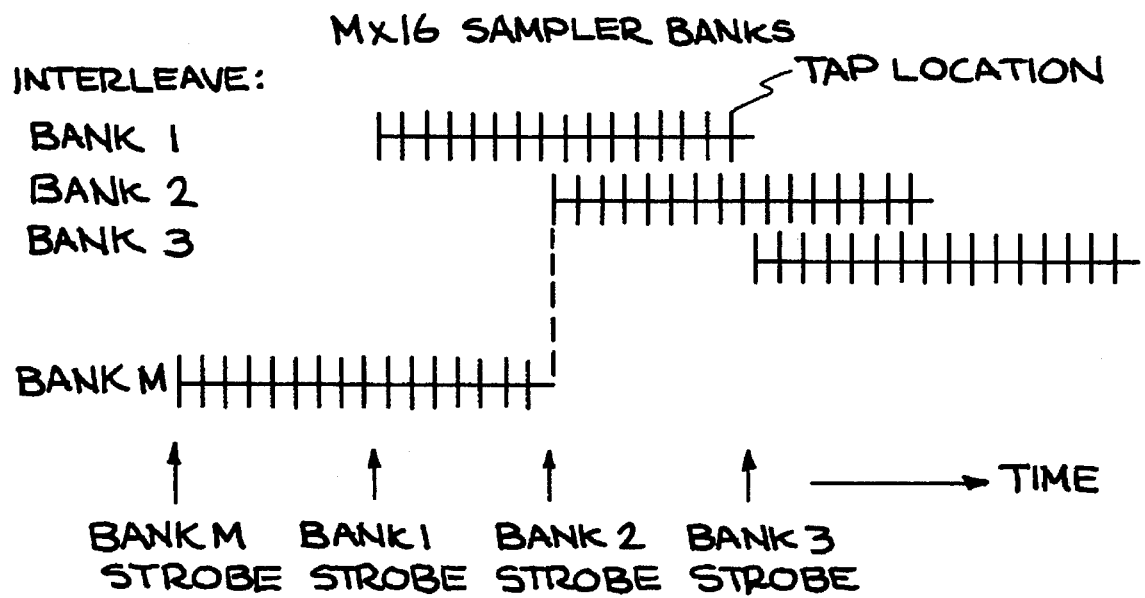
FIG. 11 illustrates an interleave technique for controlling the timing of the samplers of FIG. 10.

FIG. 11 depicts an interbank timing scheme with the sample timing interleaved to increase the sample density to greater than that of each bank alone. In this example each bank comprises a tapped transmission line with 16 samplers. The interleave technique starts strobing the next bank half way plus ½ a sample spacing into the strobing of the present bank. The last bank, M, ends at the half way minus ½ sample spacing into the first bank, in order to form a gap-free cycle for the next strobe in a train of pulses to initiate.

This two-fold interleave technique can be extended to interleaves of three-fold and higher for commensurately higher sample densities.

As each bank is strobed, kickout pulses are generated in one bank that can couple to the other banks just as they are being strobed, and thus the sampled signal will be contaminated with strobe kickout. To reduce this problem, the M-way signal splitter (amplifiers 505–508) is designed to have high reverse transfer attenuation, i.e., high reverse isolation. The M-way splitter will be further discussed below.

Kickout pulses can also linger within each bank through multiple reflections off the signal line end points. For this reason, each bank is both source end (506) and distal end (511) terminated. The phrase "source end terminated" refers to a matched impedance condition between the signal line (510) and the circuit amplifier (506) providing the signal to the signal line.

If the terminations are not perfect, they will reflect a fraction, $\Gamma$, of the kickout pulse which will transit the 1 ns signal line to the opposite termination, which will also reflect a fraction $\Gamma$ (assumed the same for simplicity), reducing the kickout by $\Gamma^2$. This process may continue for one or two more reflections before that bank is restrobed. At the time of restrobing, kickout has been reduced by at least $\Gamma^3$. As a numeric example, assume kickout K=0.1 of signal and $\Gamma$=0.1. Residual kickout is thus reduced to $K\Gamma^3$=0.0001 of the signal, well below the noise floor of almost any realizable system.

If each bank is driven by an additional signal line length of 1 ns, at least two absorptive reflections of the strobe kickout will occur before the bank is recycled. For K=0.1 and $\Gamma$=0.1, residual kickout is $K\Gamma^2$=0.001, about 60 dB below the signal. The additional 1 ns signal line length provides for interconnect cables to each bank.

The advantage to a large number of banks, e.g., M=16, is that the length of each signal transmission line may be reduced by M, thereby minimizing transmission line losses and providing for more partially absorptive reflections, $\Gamma$, of the kickout pulse off the end terminations before restrobing.

The distal termination (512) is simply a broadband termination resistor such as a microwave chip resistor. The source termination (506) may be either active or passive as shown in FIGS. 12 and 13, respectively.

Figure 12:
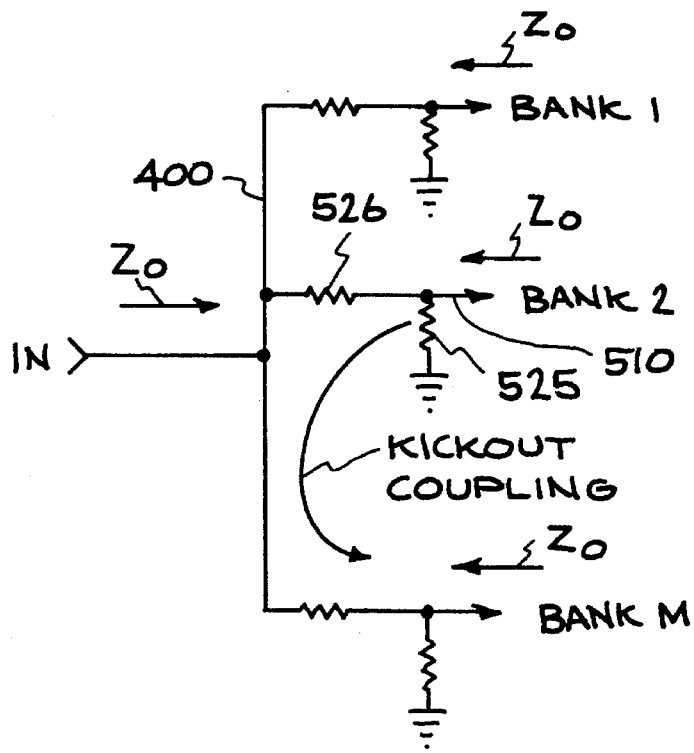
FIG. 12 illustrates a resistive divider for the input signal for use in the sampler of FIG. 10.

Passive source termination consists of an M-way resistive splitter as shown in FIG. 12. Thus, the passive source termination consists of a first resistor 525 from the input of the signal line 510 to ground and a second resistor 526 from the input of the signal line 510 to the signal input transmission line 400. Similar resistive terminations for the splitter are provided for each of the M banks.

It may be necessary to introduce additional attenuation (525, 526) in the splitter for small values of M in order to reduce interbank strobe kickout coupling (526) to a satisfactory level. Of course, signal sensitivity suffers with this method, so an active splitter may be preferred.

Figure 13:
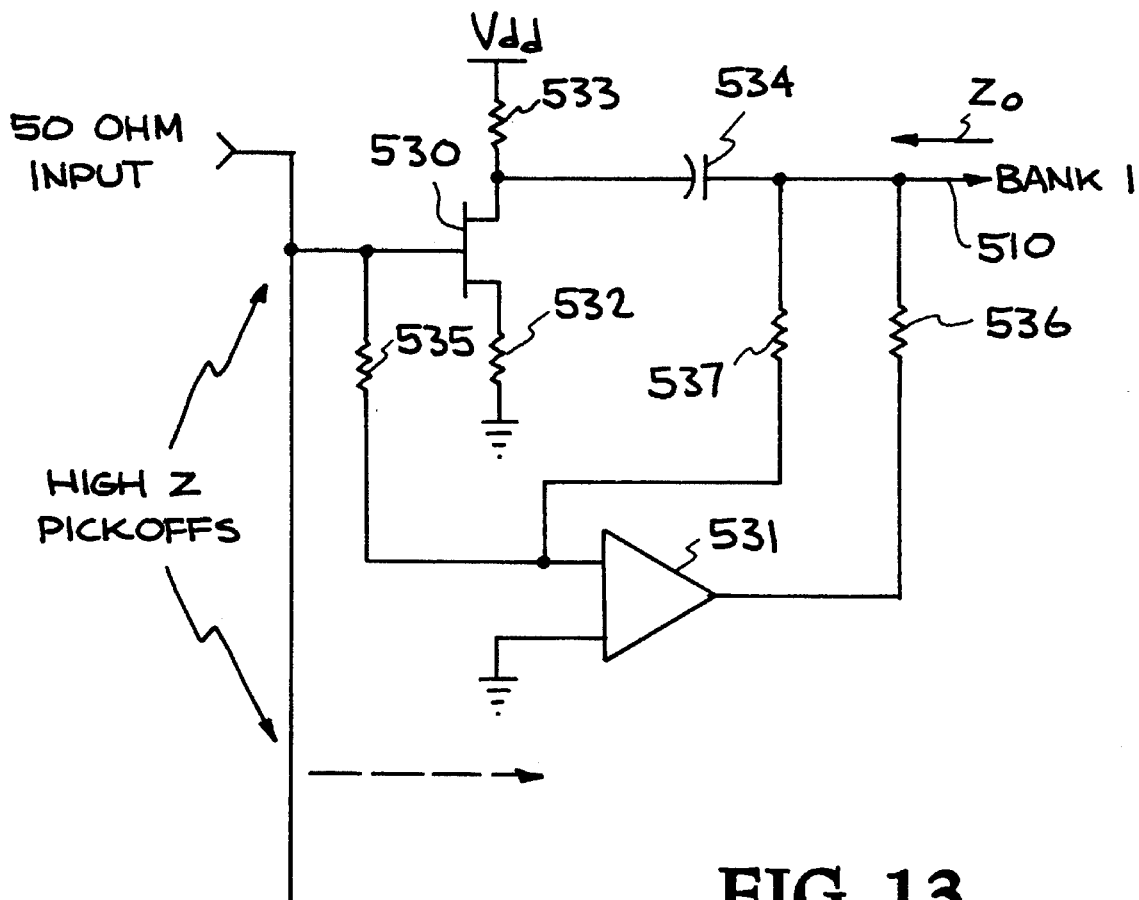
FIG. 13 illustrates an active divider for use with the plurality of sample banks of FIG. 10.

An example of an active splitter is shown in FIG. 13, and consists of a number M of FETs (e.g., 530) connected to a tapped transmission line 510. Each FET 530 provides an AC coupled broadband gain of ~1× with an output impedance, Zo, equal to the signal line impedance, usually 50 ohms. The DC path is through operational amplifier 531, which compares the DC and low frequency components on the input line with that on the output line and corrects for any difference. Errors are minimized by the high gain of amplifier 531, typically 100K. Thus, the input to the splitter for a given bank is connected to the gate of FET 530. The source of the FET 530 is connected through resistor 532 to ground. The drain is coupled through resistor 533 to the supply voltage. Also, the drain of the FET 530 is coupled through capacitor 534 to the input of the transmission line 510 for the input signal. The negative input to the amplifier 531 is supplied through resistor 535 from the transmission line 400 supplying the input signal. The positive input of the amplifier 531 is coupled to ground. The output of the amplifier 531 is supplied through resistor 536 to the input of the bank. Also, resistor 537 is connected from the input of the bank (line 510) to the inverting input of the amplifier 531 for feedback. Resistor 536 may be on the order of 500 ohms, while resistor 537 is on the order of 100 Kohms. Similarly, resistor 535 will be on the order of 100 Kohms. Resistor 532 may be on the order of 11.5 ohms, while resistor 533 may be on the order of 50 ohms. The capacitor 534 may be on the order of 0.1 microFarads.

Using commercially available hetero-junction FETs with a gate-drain capacitance on the order of 0.02 pF, the step response is 20 ps, and reverse isolation for a 50 ps wide strobe kickout pulse is 25×, reducing strobe kickout from 10% of signal amplitude to about 0.4% of signal amplitude. The kickout would thus appear at the 0.4% level on an adjacent sampler bank that is actively sampling. Extensions of the active splitter, or combinations of active circuitry and passive splitters may be used to further reduce strobe kickout effects.

The transmission line 400 is configured to drive the active splitter such that there are 5 picosecond lengths of 70 ohm microstrip on each side of the input to the FET 530. Each FET driver is separated by a 0.24 nanosecond length of 50 ohm microstrip. The FET is implemented using a gallium arsenide FET high electron mobility transistor for very high speed.

Figure 14:
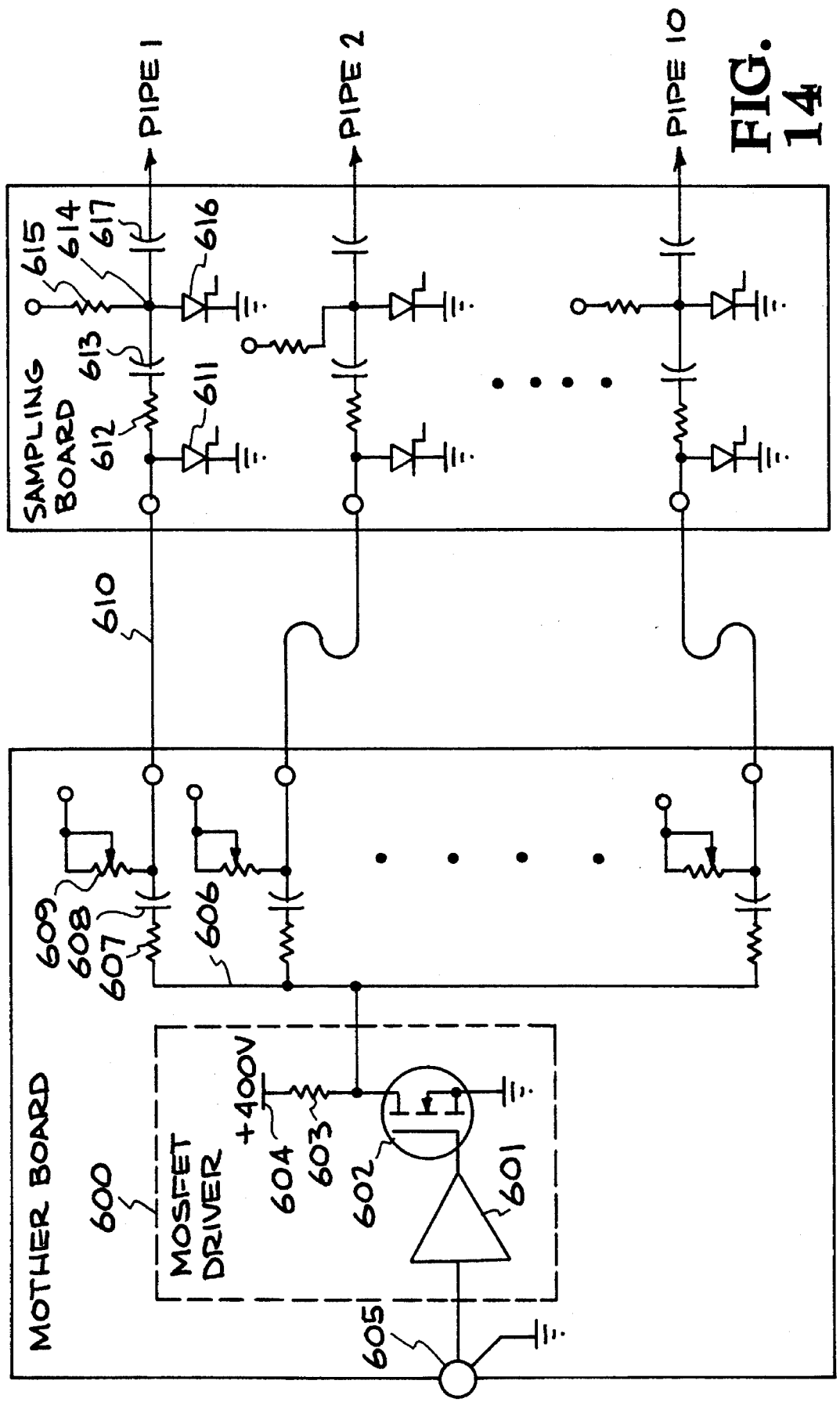
FIG. 14 illustrates the strobe signal divider for use with the high speed sampler of FIG. 10.
Figure 15:
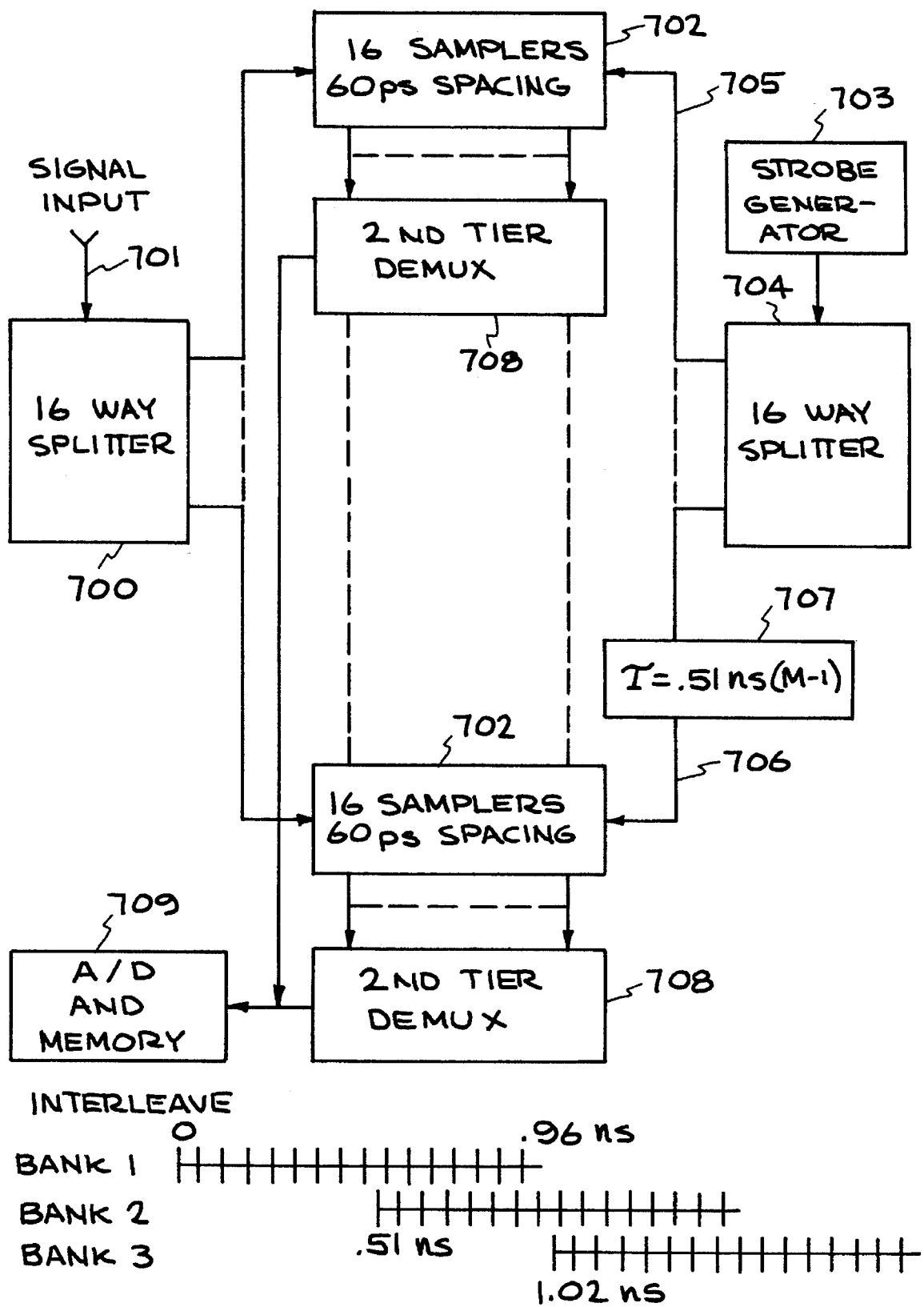
FIG. 15 is a schematic diagram of a two-tier high speed demultiplexer according to the present invention.

FIG. 14 illustrates the strobe splitting technology for lower repetition rate applications. The strobe generator 404 of FIG. 9 may consist of an MOSFET driver, generally 600. The MOSFET driver 600 includes a buffer amplifier 601 driving a high voltage MOSFET device 602. The high voltage MOSFET device has its source coupled to ground and its drain coupled across resistor 603 to a 400 volt supply 604. The input to the amplifier 601 is supplied at coaxial connector 605. A trigger signal of about 5 volts with a rise time of approximately 5 nanoseconds is supplied to the input of the MOSFET driver 600. The output of the MOSFET driver 600 is a pulse dropping from about 400 volts to about 0 volts in about 1 nanosecond. This pulse is split on line 606 to a plurality of channels. Each channel consists of a resistor 607 and capacitor 608 in series. A trimming resistor 609 is coupled to the opposite side of the capacitor 608. Also, the opposite side of the capacitor 608 is coupled to a length of coaxial cable 610. This coax is typically 50 ohm teflon coax which is cut to various lengths to control the strobe timing. Thus, the strobe pulses are separated in time. In this embodiment, the strobe to pipe 2 is delayed 30 picoseconds to interleave pipes 1 and 2 as a pair. Strobes to subsequent pairs of pipes are incrementally delayed 1 ns to concatenate them across 5 ns. Thus, the pipes in the second pair are strobed at 2 nsec and 2.03 nsec, the pipes in the third pair are strobed at 3 nsec and 3.03 nsec and so on. Such that pipe 10 (the second pipe in the fifth pair) is strobed at 5.03 nsec.

The output of each coaxial cable length 610 is coupled to the input of the strobe generator on the circuit board, as described above with respect to FIG. 6. Thus, each strobe generator includes a first 250 picosecond step recovery diode 611 coupled across series resistor 612 and capacitor 613 to node 614. Node 614 is coupled across resistor 615 to the supply voltage, and across a 60 picosecond step recovery diode 616 to ground. Although capacitor 617 is illustrated in FIG. 14 between the step recovery diode 616 and the pipe (sampler bank), such capacitor is actually placed at the opposite end of the strobe line, as shown in FIG. 6 in the preferred embodiment.

The output of each of the strobe generators is a signal dropping from about 0 volts to about −30 volts with a fall time of about 60 picoseconds. Because the variable length of coaxial cable 610 may be easily replaced using a shop replaceable cable unit, the relative timing of the sample banks in the array can be precisely controlled to meet a variety of configurations.

For high repetition rates, e.g., 250 million samples per second, MOSFET driver 600 may be replaced with a standard 250 MHz RF power amplifier, with the trigger input supplied with a 250 MHz clock.

FIG. 15 is a schematic block diagram of a high speed sampling demultiplexer according to the present invention. The sampling demultiplexer includes an input splitter 700 which splits an input signal on line 701 into a plurality of signal lines (1–16). Each of the signal lines is supplied to a bank of samplers 702 for each of the signal lines. Similarly, a strobe generator 703 generates a strobe signal to a sixteen way strobe splitter 704. The strobe splitter supplies strobe signals on line 705 to a first bank. The other banks are strobed with a signal line 706 which includes a delay 707 to control the timing of the pulse to the plurality of banks 702. This structure is described in detail above. However, rather than multiplexing the outputs of the samplers into a single output line, as shown with respect to FIG. 7, the outputs of the samplers in the high speed demultiplexer of FIG. 15 are supplied to second tier demultiplexers 708. The second tier demultiplexers 708 may consist of CMOS monolithic sample and hold integrated circuits, which can hold a series of up to 1000 samples per input. Thus, there would be a single sample and hold monolithic sampling device for each of the 256 samplers in the embodiment of FIG. 15. These devices are then coupled to an analog to digital converter and memory system 709 such as that described above; however, the A/D converter and memory system can be operated at a much lower rate. Using this second tier demultiplexing, much longer sampling lengths can be accomplished.

An alternative technique for the second level demultiplexing is to use high speed digital-to-analog converters at each of the outputs of the samplers. These converters would then be directly coupled to a memory system.

Thus, each sampler output in FIG. 15 may be used to drive another, or second tier, sampling demultiplexer. Due to the reduced output data rate that this invention provides, a variety of monolithic technologies may be considered for the second tier, such as CMOS, silicon bipolar, or MOS VLSI integrated circuits. The output of the second tier demultiplexer will then be sufficiently slow that low cost, high resolution ND converters may be used for final digitization. At 33 GS/s, this invention can provide 60dB dynamic range, well beyond prior art digitizers at 4 GS/s and <40 dB dynamic range.

FIG. 15 depicts a 16 bank 1:256 demultiplexer with, for example, a 33 GS/s input sample rate and a 130 MHz output data rate. A data rate of 33 GS/s is consistent with the sampler designs described above. The 130 MHz strobe timing to each bank is delayed 0.51 ns per bank to effect a 30 ps interleave for an equivalent sampling rate of 33 GS/s using 60 ps sample spacing within each bank. The advantage of a large number of banks, e.g., M=16, is that strobe kickout effects are generally reduced in proportion to $M^2$, and the strobe recycle time to each bank is stretched by M, allowing ample time for the kickout pulses to be locally absorbed within each sampler bank.

Another advantage of a large number of sampler banks is that the length of each signal transmission line is reduced by M, thereby minimizing the effects of sampler and transmission line losses. Also, physical implementation is facilitated by breaking the entire assembly into smaller units compatible with common construction methods.

It is common in the art to apply digital corrections to the signals sampled and digitized by demultiplexer and ND converter combinations. Static corrections include baseline offset, gain error, and amplitude linearity. Dynamic corrections include sample spacing nonuniformities. In this invention, sample spacing is essentially controlled through the accuracy of the physical layout, which is quite accurate. However, small variations, <10 ps, may arise due to thresholding effects in each individual sampler, and for certain applications requiring very low timing distortion, prior art dynamic distortion correction may be applied.

One form of distortion peculiar to the tapped line structure of this invention is the slight loss in bandwidth as a function of position along the signal transmission line, due to sampler loading and normal transmission line losses. However, this loss may be accurately compensated with standard digital signal processing (DSP) techniques. Specifically, appropriate portions of adjacent sampler outputs would be added to, or subtracted from each sampler output in such a fashion that a digital inverse transfer function of the signal line loss is formed.

ENHANCEMENTS

This system may be modified with a variety of enhancements including non-uniform tap spacing, non-uniform tap weighting, coherent sample integration, monolithic embodiment, block concatenation, auto calibration, continuous conversion, and others.

The transient sampler is a generic instrument with an application range almost as wide as that of conventional oscilloscopes. The cost and size of existing commercial samplers has limited their widespread use. The present invention reduces both the cost and size by a factor of about 5 compared to CRT based digitizers, as described above in the background of the invention.

The samplers are particularly suited to recording single event, sub-nanosecond transients generated by laser systems. As the speed of electronic devices increases, the needs for high speed instrumentation grows. For example, GaAs digital logic devices operate at sub-nanosecond speeds and the testing of these devices is becoming increasingly difficult, especially in catching short glitches that must be screened out during manufacture.

The embodiments described above include sample gates at positions along the sample transmission line that are uniformly spaced. An alternative embodiment employs non-uniform spacing of sample gates, such as may be useful in signal processing applications or otherwise.

Emerging technologies, such as ultra-wide band radar, spread spectrum communications, and low probability of intercept radar and communications are hampered by the lack of low-cost available electronics. The present invention and enhancements to it will be the first devices specifically suited to time domain reception for such high speed effects.

PULSE COMPRESSOR APPLICATION

FIG. 16 illustrates a pulse compressor implemented using the high speed sampler of the present invention. An input signal is received on line 800. It is supplied to a sampler bank 801 including a meandered transmission line and a strobe line, as described above, within the sampler bank. A strobe generator 802 supplies a strobe signal to the strobe transmission line in the sampler bank. The spacing of the samplers in the sampler bank 801 is set to match the frequency of the incoming pulse train.

The outputs of the charge holding capacitors in the samplers in the bank 801 are coupled to a multiplier 803. The multiplier multiplies the outputs of all the samplers together to generate an output on line 804. Thus, when the input signal includes a plurality of cycles which line up with each of the samplers in the sample bank, the multiplier generates a high output. If not all the samplers pick up a peak on the input signal, then the output of the multiplier will be much lower. This technique is useful in radar pulse compression.

CONCLUSION

This invention will enhance current products, and will enable new technologies. One market, for example, is the digital storage oscilloscope (DSO) market. Over the past decade, the test and measurement industry has been upgrading conventional analog oscilloscopes to DSOs. For example, Tektronix offers a model 7104 analog oscilloscope with 1GHz bandwidth. Current DSO offerings by Tektronix, Hewlett-Packard, and LeCroy sample at 2–4 GS/s and have an analog bandwidth on the order of 500 MHz. The cost of a DSO is slightly higher than its analog counterpart, but the DSO offers vastly longer record lengths, waveform storage, digital signal processing, and digital output. Key limitations to current DSO performance are low sampling rates and poor analog bandwidth. This invention improves sampling rates by 10× or more, and brings analog bandwidth up to or exceeding the sampling rate.

Emerging technologies such as Ultra-Wide Band (UWB) radar and spread-spectrum communications will greatly benefit from this invention. In UWB radar, there is currently no means available to digitize returns with sufficient detail and record length to make high resolution (1 cm feature size) imaging radar possible. High resolution imaging radar will have a significant impact on aviation.

Communications is another area that could benefit from this invention. Demultiplexers are a basic component in time division multiplexed (TDM) modulation, which is a common method to combine multiple channels onto a single channel for transmission through fiber optic, microwave, or satellite data links. Current commercial demultiplexer technology, as used by the communications industry, runs in the few gigasamples/sec region.

The foregoing description of preferred embodiments of the present invention has been provided for the purposes of illustration and description. It is not intended to be exhaustive or to limit the invention to the precise forms disclosed. Obviously, many modifications and variations will be apparent to practitioners skilled in this art. It is intended that the scope of the invention be defined by the following claims and their equivalents.

What is claimed is:

1. A high speed sampler, comprising: a plurality of sampler banks, each bank including a sample transmission line for transmitting a bank input signal;

a strobe transmission line for transmitting a bank strobe signal; and sampler circuitry, connected to the strobe transmission line and the sample transmission line at a plurality of positions, which samples the bank input signal at the plurality of positions in response to the bank strobe signal to supply a plurality of samples of the input signal with a first effective sampling rate; strobe control circuitry, coupled with the plurality of sampler banks, which supplies a sequence of bank strobe signals to the strobe transmission lines in each of the plurality of banks, including circuits for controlling timing of the bank strobe signals;

input circuitry, coupled with the plurality of sampler banks, which supplies an input signal to the sample transmission lines in each of the plurality of banks; and second tier demultiplexing circuitry coupled to the sampler circuitry in the plurality of positions which senses each of a plurality of samples to store samples developed in response to a plurality of strobe signals from each position for later processing.

2. The high speed sampler of claim 1, wherein the second tier demultiplexing circuitry comprises a plurality of sets of sample and hold circuits, each set holding a plurality of samples from a given position in the sampling circuitry.

3. The high speed sampler of claim 1, wherein the second tier demultiplexing circuitry comprises a plurality of analog to digital converters coupled to respective positions in the plurality of positions in the sampling circuitry, and digital memory coupled to the analog to digital converters, each analog to digital converter converting a plurality of samples from a given position in the sampling circuitry.

4. The high speed sampler of claim 1, wherein the input circuitry comprises a signal splitter with high reverse attenuation.

5. The high speed sampler of claim 1, wherein the sample transmission line in a particular sampler bank has a proximal end coupled to the input circuitry and a distal end, and including a broadband termination resistor on the distal end of the sample transmission line.

6. The high speed sampler of claim 1, wherein the sample transmission lines in the plurality of sampler banks have respective proximal ends coupled to the input circuitry and respective distal ends, and wherein the input circuitry comprises a passive resistive splitter coupled to the proximal ends, and broadband termination resistors on the distal ends providing transmission line terminations which suppress strobe kickout on the respective sample transmission lines.

7. The high speed sampler of claim 1, wherein the sample transmission lines in the plurality of sampler banks have respective proximal ends coupled to the input circuitry and respective distal ends, and wherein the input circuitry comprises an active splitter coupled to the proximal ends.

8. The high speed sampler of claim 7, including broadband termination resistors on the distal ends, and at the active splitter with the broadband termination resistors providing transmission line terminations which suppress strobe kickout on the respective sample transmission lines.

9. The high speed sampler of claim 8, wherein the active splitter comprises an input transmission line receiving the input signal, and a plurality of high speed drivers coupled to the input transmission line and to respective ones of the sample transmission lines in the plurality of banks, which drive the corresponding bank in response to the input signal on the transmission line.

10. The high speed sampler of claim 9, wherein each of the high speed drivers comprise:

an FET transistor having a gate connected to the input transmission line, and a drain coupled to the sample transmission line of the respective bank, and an operational amplifier circuit connected between the input transmission line and sample transmission line to control lower frequency signals on the sample transmission line.

11. The high speed sampler of claim 1, wherein the strobe control circuitry includes a trigger signal generator, and a plurality of pulse forming networks coupled to respective strobe transmission lines, and wherein the circuitry for controlling timing comprises a fanout circuit coupled to the trigger signal generator for supplying a trigger signal to each of the plurality of pulse forming networks with controlled timing.

12. The high speed sampler of claim 11, wherein the trigger signal generator comprises an RF power amplifier.

13. The high speed sampler of claim 11, wherein the controlled timing is set with varying lengths of cable between the trigger signal generator and the plurality of pulse forming networks.

14. The high speed sampler of claim 1, wherein the circuitry for controlling timing incrementally delays the bank strobe signals so that the samples in respective pluralities of samples from at least a subset of the plurality of banks are interleaved in time.

15. The high speed sampler of claim 1, wherein the circuitry for controlling timing incrementally delays the bank strobe signals so that the samples in respective pluralities of samples from at least a subset of the plurality of banks are concatenated in time.

16. The high speed sampler of claim 1, wherein the sampler circuitry in at least one bank includes a plurality of diode bridge sample gates connected to the sample transmission line at respective ones of the plurality of positions.

17. A high speed sampler, comprising: a plurality of sampler banks, each bank including a sample transmission line for transmitting a bank input signal;

a strobe transmission line for transmitting a bank strobe signal; and sampler circuitry, connected to the strobe transmission line and the sample transmission line at a plurality of positions, which samples the bank input signal at the plurality of positions in response to the bank strobe signal to supply a plurality of samples of the input signal;

strobe control circuitry, coupled with the plurality of sampler banks, which supplies the bank strobe signals to the strobe transmission lines in each of the plurality of banks, including circuits for controlling timing of the bank strobe signals; and input circuitry, coupled with the plurality of sampler banks, which supplies an input signal to the sample transmission lines in each of the plurality of banks in parallel, and suppresses strobe kickout.

18. The high speed sampler of claim 17, wherein the input circuitry comprises a signal splitter with high reverse attenuation 19. The high speed sampler of claim 17, wherein the sample transmission line in a particular sampler bank has a proximal end coupled to the input circuitry and a distal end, and including a broadband termination resistor on the distal end of the sample transmission line.

20. The high speed sampler of claim 17, wherein the sample transmission lines in the plurality of sampler banks have respective proximal ends coupled to the input circuitry and respective distal ends, and wherein the input circuitry comprises a passive resistive splitter coupled to the proximal ends, and broadband termination resistors on the distal ends providing transmission line terminations which suppress strobe kickout on the respective sample transmission lines.

21. The high speed sampler of claim 17, wherein the sample transmission lines in the plurality of sampler banks have respective proximal ends coupled to the input circuitry and respective distal ends, and wherein the input circuitry comprises an active splitter coupled to the proximal ends.

22. The high speed sampler of claim 21, including broadband termination resistors on the distal ends, the active splitter and the broadband termination resistors providing transmission line terminations which suppress strobe kickout on the respective sample transmission lines.

23. The high speed sampler of claim 21, wherein the active splitter comprises an input transmission line receiving the input signal, and a plurality of high speed drivers coupled to the input transmission line and to respective ones of the sample transmission lines in the plurality of banks, which drive the corresponding bank in response to the input signal on the transmission line.

24. The high speed sampler of claim 23, wherein each of the high speed drivers comprise:

an FET transistor having a gate connected to the input transmission line, and a drain coupled to the sample transmission line of the respective bank, and an operational amplifier circuit connected to control lower frequency signals on the sample transmission line.

25. The high speed sampler of claim 17, wherein the strobe control circuitry includes a trigger signal generator, and a plurality of pulse forming networks coupled to respective strobe transmission lines, and wherein the circuitry for controlling timing comprises a fanout circuit coupled to the trigger signal generator for supplying a trigger signal to each of the plurality of pulse forming networks with controlled timing.

26. The high speed sampler of claim 25, wherein the trigger signal generation comprises an RF power amplifier.

27. The high speed sampler of claim 25, wherein the controlled timing is set with varying lengths of cable between the trigger signal generator and the plurality of pulse forming networks.

28. The high speed sampler of claim 17, wherein the circuitry for controlling timing incrementally delays the bank strobe signals so that the samples in respective pluralities of samples from at least a subset of the plurality of banks are interleaved in time.

29. The high speed sampler of claim 17, wherein the circuitry for controlling timing incrementally delays the bank strobe signals so that the samples in respective pluralities of samples from at least a subset of the plurality of banks are concatenated in time.

30. The high speed sampler of claim 17, wherein the sampler circuitry in at least one bank includes a plurality of diode bridge sample gates connected to the sample transmission line at respective ones of the plurality of positions.

31. The high speed sampler of claim 17, further including means, coupled to the sampler circuitry in the plurality of banks, for scanning out the samples from the plurality of banks in coordination with the circuits for controlling timing.

* * * * *